United States Patent
Oh et al.

(10) Patent No.: US 12,230,573 B2
(45) Date of Patent: Feb. 18, 2025

(54) SEMICONDUCTOR DEVICE AND DATA STORAGE SYSTEM INCLUDING THE SAME

(71) Applicant: Samsung Electronics Co., Ltd., Suwon-si (KR)

(72) Inventors: Seyong Oh, Suwon-si (KR); Kihyun Kim, Hwaseong-si (KR); Jihwan You, Hwaseong-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 392 days.

(21) Appl. No.: 17/713,559

(22) Filed: Apr. 5, 2022

(65) Prior Publication Data

US 2022/0336358 A1 Oct. 20, 2022

(30) Foreign Application Priority Data

Apr. 15, 2021 (KR) .......................... 10-2021-0049014

(51) Int. Cl.
*H01L 23/535* (2006.01)
*H10B 43/27* (2023.01)
*H10B 43/40* (2023.01)

(52) U.S. Cl.
CPC .......... *H01L 23/535* (2013.01); *H10B 43/27* (2023.02); *H10B 43/40* (2023.02)

(58) Field of Classification Search
None
See application file for complete search history.

(56) References Cited

U.S. PATENT DOCUMENTS

| | | | |
|---|---|---|---|
| 7,037,835 B2 | 5/2006 | Lee et al. | |
| 7,176,119 B2 | 2/2007 | Gambino et al. | |
| 8,216,932 B2 | 7/2012 | Jeong et al. | |
| 9,728,549 B2 | 8/2017 | Yun et al. | |
| 10,381,434 B1 | 8/2019 | Pachamuthu et al. | |
| 2002/0024139 A1 | 2/2002 | Chan et al. | |
| 2005/0250307 A1 | 11/2005 | Park et al. | |
| 2022/0045083 A1* | 2/2022 | Sim | H10B 43/27 |

FOREIGN PATENT DOCUMENTS

| KR | 2005/0123454 A | 12/2005 |
|---|---|---|
| KR | 2009/0076359 A | 7/2009 |

* cited by examiner

*Primary Examiner* — Michelle Mandala
(74) *Attorney, Agent, or Firm* — Harness, Dickey & Pierce, P.L.C.

(57) ABSTRACT

A semiconductor device and a data storage system including the same are provided. The semiconductor device includes a lower structure including a semiconductor substrate, a circuit element on the semiconductor substrate, a circuit interconnection structure on the semiconductor substrate, the circuit interconnection structure including a plurality of connection patterns on different levels and electrically connected to the circuit element, and a lower insulating structure covering the circuit element and the circuit interconnection structure; and an upper structure including an upper substrate in contact with an upper surface of the lower insulating structure, a stack structure on the upper substrate, the stack structure including interlayer insulating layers and gate electrodes alternately stacked in a vertical direction, and a vertical memory structure penetrating through the stack structure in the vertical direction.

20 Claims, 22 Drawing Sheets

SEMICONDUCTOR DEVICE AND DATA STORAGE SYSTEM INCLUDING THE SAME

CROSS-REFERENCE TO RELATED APPLICATION(S)

This application claims the benefit under 35 USC 119(a) of Korean Patent Application No. 10-2021-0049014 filed on Apr. 15, 2021 in the Korean Intellectual Property Office, the entire disclosure of which is incorporated herein by reference for all purposes.

BACKGROUND

The present inventive concepts relate to a semiconductor device and a data storage system including the same.

Semiconductor devices capable of storing high-capacity data in electronic systems requiring data storage are in demand. Accordingly, a method for increasing a data storage capacity of a semiconductor device is being studied. For example, as one method for increasing the data storage capacity of a semiconductor device, a semiconductor device including memory cells arranged three-dimensionally instead of memory cells arranged two-dimensionally has been proposed.

SUMMARY

Example embodiments provide a semiconductor device having improved integration.

Example embodiments provide a data storage system including a semiconductor device.

According to some example embodiments, a semiconductor device may include a lower structure including a semiconductor substrate, a circuit element on the semiconductor substrate, a circuit interconnection structure on the semiconductor substrate, the circuit interconnection structure including a plurality of connection patterns on different levels and electrically connected to the circuit element, and a lower insulating structure covering the circuit element and the circuit interconnection structure; an upper structure including an upper substrate in contact with an upper surface of the lower insulating structure, a stack structure on the upper substrate, the stack structure including interlayer insulating layers and gate electrodes alternately stacked in a vertical direction, and a vertical memory structure penetrating through the stack structure in the vertical direction; and a contact plug penetrating through at least a portion of the lower insulating structure such that the contact plug contacts an uppermost connection pattern, among the plurality of connection patterns. The lower insulating structure may include a first insulating layer, a capping layer and a second insulating layer sequentially stacked in a region between the upper substrate and the uppermost connection pattern, and the capping layer may include a material different from a material of the first insulating layer and a material of the second insulating layer.

According to some example embodiments, a semiconductor device may include an upper structure including an upper substrate, a stack structure including interlayer insulating layers and gate electrodes alternately stacked on the upper substrate in a vertical direction, and a vertical memory structure penetrating through the stack structure in the vertical direction; a lower structure under the upper substrate, the lower structure including a semiconductor substrate, a circuit element on the semiconductor substrate, a circuit interconnection structure on the semiconductor substrate, the circuit interconnection structure including at least three connection patterns, the at least three connection patterns including an uppermost connection pattern in an uppermost portion, and a lower connection pattern in a lower portion, an intermediate connection pattern between the uppermost connection pattern and the lower connection pattern, an upper via electrically connecting the uppermost connection pattern and the intermediate connection pattern, and a lower insulating structure covering the circuit element and the circuit interconnection structure, the lower insulating structure including a first insulating layer, a capping layer and a second insulating layer sequentially stacked in a portion between the upper substrate and the uppermost connection pattern; and a contact plug penetrating through the first insulating layer, the capping layer, and the second insulating layer and extending into the uppermost connection pattern. A thickness of the uppermost connection pattern may be greater than a thickness of the intermediate connection pattern, the capping layer may include a material different from a material of the first insulating layer and a material of the second insulating layer, a thickness of the second insulating layer may be greater than a thickness of the capping layer, the thickness of the capping layer may be greater than the thickness of the first insulating layer, the uppermost connection pattern may include an upper surface of which at least a portion has a curved surface shape, and the contact plug may penetrate through a portion of the upper surface of the uppermost connection pattern and extends into the uppermost connection pattern.

According to some example embodiments, a data storage system may include a semiconductor device including an input/output pad; and a controller electrically connected to the semiconductor device through the input/output pad and configured to control the semiconductor device. The semiconductor device may further include an upper structure including an upper substrate in contact with an upper surface of the lower insulating structure, a stack structure on the upper substrate, the stack structure including interlayer insulating layers and gate electrodes alternately stacked in a vertical direction, and a vertical memory structure penetrating through the stack structure in the vertical direction, a lower structure including a semiconductor substrate, a circuit element on the semiconductor substrate, a circuit interconnection structure including a plurality of connection patterns on different levels, the plurality of connection patterns electrically connected to the circuit element, and a lower insulating structure covering the circuit element and the circuit interconnection structure, the lower insulating structure including a first insulating layer, a capping layer and a second insulating layer sequentially stacked in a portion between the upper substrate and the uppermost connection pattern, and a contact plug penetrating through at least a portion of the lower insulating structure such that the contact plug contacts an uppermost connection pattern, of the connection patterns. The capping layer may include a material different from a material of the first insulating layer and a material of the second insulating layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, spatially relative terms such as "upper," "middle," "lower", vertical, and/or the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Terms such as "first," "second," and "third" may be used to describe various elements. These terms are used to distinguish one element from another element, but the elements are not otherwise limited by the terms. For example, a "first element" may be termed a "second element" without departing from the scope of the disclosure.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1A:
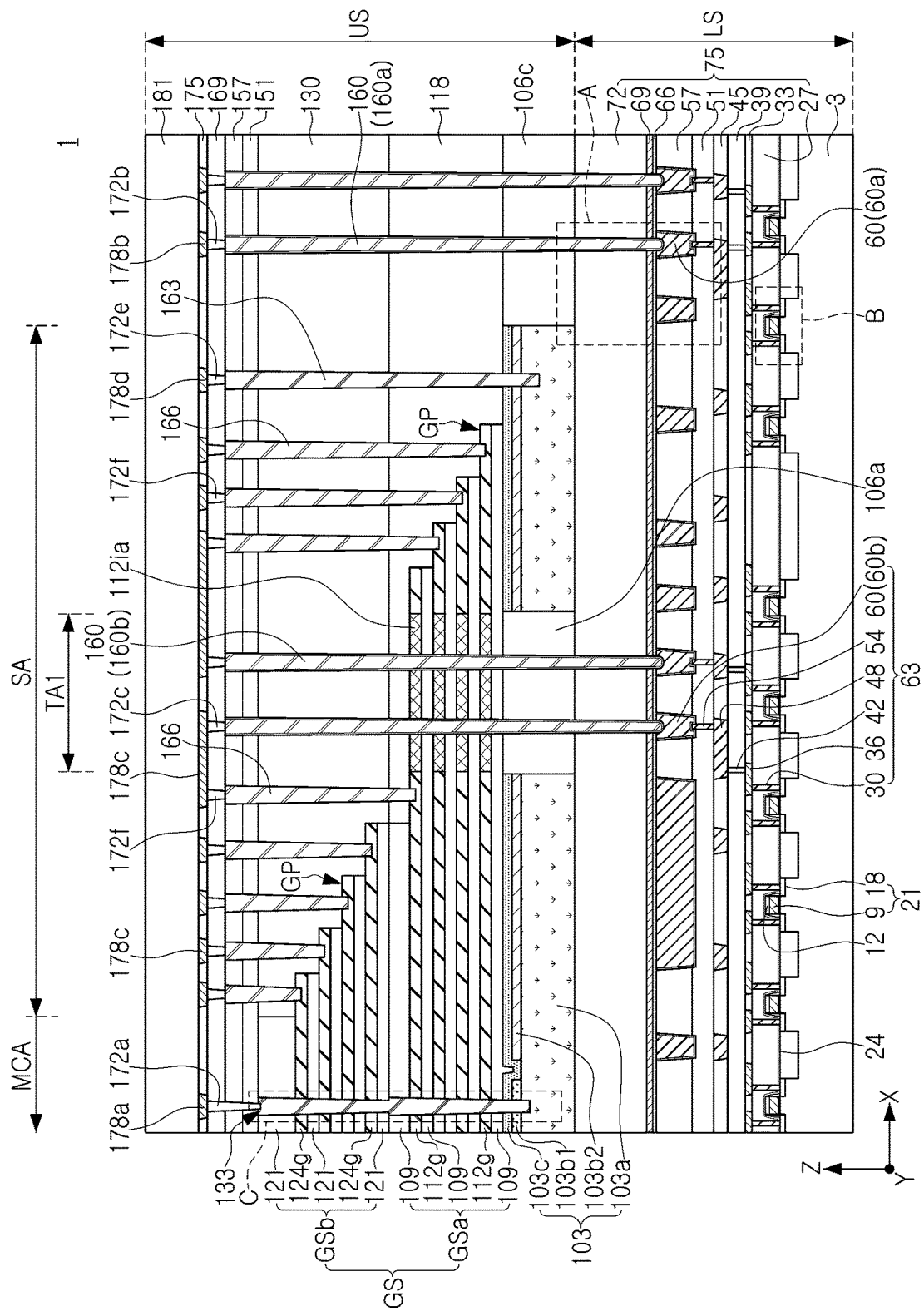
FIGS. 1A, 1B, 2A, and 2B are schematic diagrams illustrating examples of a semiconductor device according to some example embodiments.
Figure 1B:
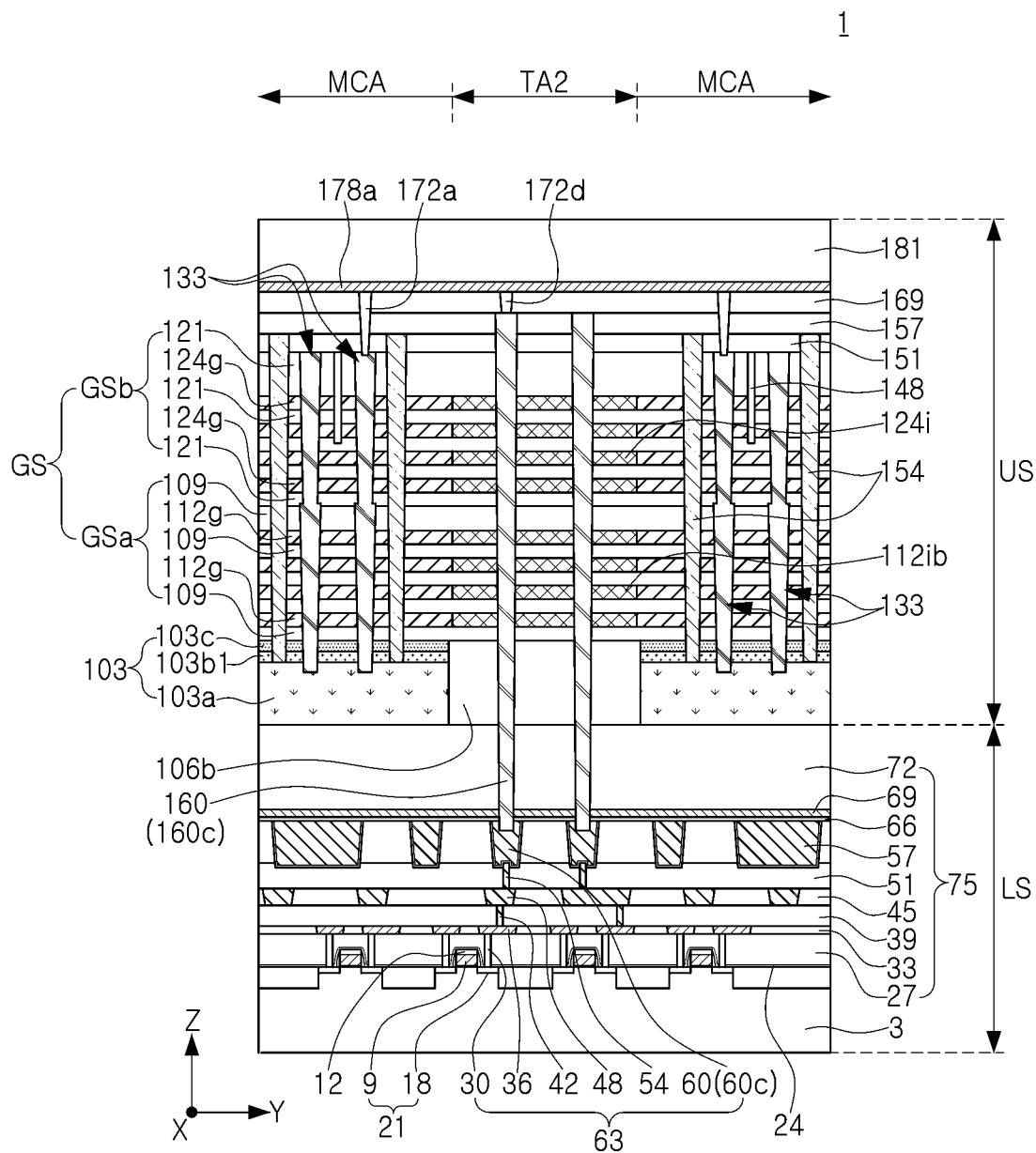
Figure 2A:
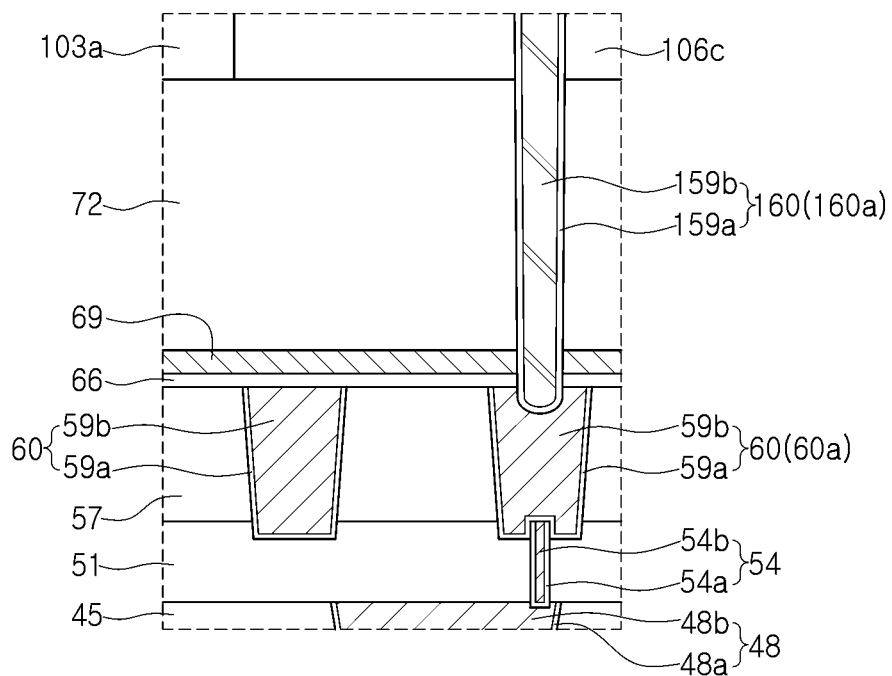
Figure 2B:
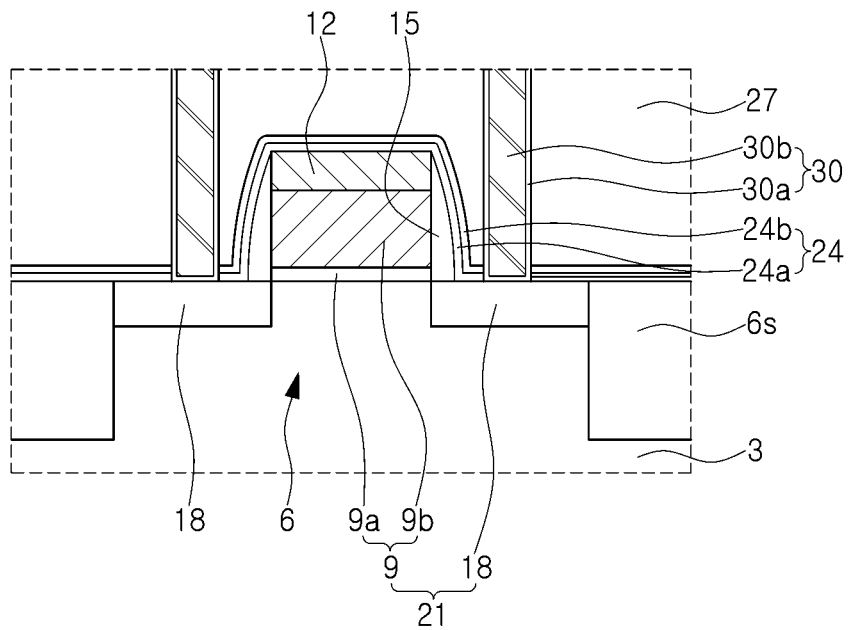

Referring to FIGS. 1A, 1B, 2A and 2B, a semiconductor device 1 according to some example embodiments may include a lower structure LS and an upper structure US on the lower structure 2. FIG. 1A is a longitudinal cross-sectional view of a semiconductor device, according to some example embodiment taken in the X direction, and FIG. 1B is a longitudinal cross-sectional view of the semiconductor device taken in the Y direction. FIG. 2A is a partially enlarged view of a portion marked with 'A' of FIG. 1A, and FIG. 2B is an enlarged view of a portion marked with 'B' of FIG. 1A.

The lower structure LS may include a semiconductor substrate 3, a circuit element 21 on the semiconductor substrate 3, a circuit interconnection structure 63 electrically connected to the circuit element 21 and on the semiconductor substrate 3, and a lower insulating structure 75 covering the circuit element 21 and the circuit interconnection structure 63 on the semiconductor substrate 3.

The lower structure LS may further include a field region 6s defining an active region 6a in the semiconductor substrate 3. The field region 6s may be formed by, e.g., shallow trench isolation.

The circuit element 21 may include a peripheral gate 9 and peripheral sources/drains 18. The peripheral gate 9 may include a peripheral gate dielectric 9a and a peripheral gate electrode 9b on the peripheral gate dielectric 9a.

The peripheral sources/drains 18 may be disposed within the active region 6a and may be spaced apart from each other. The peripheral gate 9 may be disposed on the active region 6a between the peripheral sources/drains 18. An area of the substrate 3 between the peripheral sources/drains 18 and under the peripheral gate 9 may form a channel.

The lower structure LS may further include a gate capping pattern 12 covering the peripheral gate 9, and a gate spacer 15 covering side surfaces of the peripheral gate 9 and the gate capping pattern 12. The gate capping pattern 12 may include a material such as silicon nitride. The gate spacer 15 may include at least one of silicon oxide, silicon oxynitride, or silicon nitride.

The lower structure LS may further include an insulating liner 24 covering the circuit element 21, on the semiconductor substrate 3 including the active region 6a and the field region 6s. The insulating liner 24 may conformally cover surfaces of the gate spacer 15 and the gate capping pattern 12. The insulating liner 24 may include silicon nitride. The insulating liner 24 may include a first liner layer 24a and a second liner layer 24b on the first liner layer 24a. The first liner layer 24a and the second liner layer 24b may include materials with different etch selectivity. For example, the first liner layer 24*a* may include silicon oxide, and/or the second liner layer 24*b* may include silicon nitride.

The lower insulating structure 75 may include a first lower insulating layer 27, a second lower insulating layer 33, a third lower insulating layer 39, a fourth lower insulating layer 45, a fifth lower insulating layer 51, a sixth lower insulating layer 57, a first insulating layer 66, a capping layer 69, and a second insulating layer 72, sequentially stacked. The first lower insulating layer 27 may be disposed on the insulating liner 24.

The circuit interconnection structure 63 may include a plurality of connection patterns 36, 48, and 60 disposed at different height levels. In some embodiments, the plurality of connection patterns 36, 48, and 60 may include at least three connection patterns disposed at different height levels. For example, the plurality of connection patterns 36, 48 and 60 may include an uppermost connection pattern 60 disposed on the uppermost portion, an intermediate connection pattern 48 disposed on an intermediate portion, a lower level than the uppermost connection pattern 60, and a lower connection pattern 36 disposed on a lowermost portion, a level lower than the intermediate connection pattern 48.

In some embodiments, a thickness of the uppermost connection pattern 60 may be greater than a thickness of the intermediate connection pattern 48. In some embodiments, a thickness of the uppermost connection pattern 60 may be greater than a thickness of the lower connection pattern 36. In some embodiments, the thickness of the uppermost connection pattern 60 may be greater than the sum of the thickness of the intermediate connection pattern 48 and the thickness of the lower connection pattern 36.

Each of the plurality of connection patterns 36, 48, and 60 may include a conductive material pattern and a conductive barrier layer covering side and bottom surfaces of the conductive material pattern. In an illustrative example, the conductive material pattern may include a metal material such as tungsten and/or the like, and the conductive barrier layer may include a metal nitride such as titanium nitride and/or the like. For example, the uppermost connection pattern 60 may include a metal material pattern 59*b* and a conductive barrier layer 59*a* covering side and bottom surfaces of the metal material pattern 59*b*, and the intermediate connection pattern 48 may include a metal material pattern 48*b* and a conductive barrier layer 48*a* covering side and bottom surfaces of the metal material pattern 48*b*.

In an example, the thickness of the conductive barrier layer 59*a* may range from about 40 Angstroms (Å) to about 120 Å. In another example, the thickness of the conductive barrier layer 59*a* may range from about 60 Å to about 100 Å.

The circuit interconnection structure 63 may further include a plurality of vias 30, 42, and 54 disposed at different height levels. The plurality of vias 30, 42, and 54 may include a lower via 30, an intermediate via 42 having a higher level than the lower via 30, and an upper via 54 having a higher level than the intermediate via 42. Each of the plurality of vias 30, 42, and 54 may include a conductive material pattern and a conductive barrier layer covering side and bottom surfaces of the conductive material pattern. For example, the upper via 54 may include a conductive material pattern 54*b* and a conductive barrier layer 54*a* covering side and bottom surfaces of the conductive material pattern 54*b*, and the lower via 30 may include a conductive material pattern 30*b* and a conductive barrier layer 30*a* covering side and bottom surfaces of the conductive material pattern 30*b*.

In some embodiments, the conductive material pattern may include a metal and/or the conductive barrier layer may include a metal nitride.

The lower via 30 may penetrate through the first lower insulating layer 27 and the insulating liner 24 and may be electrically connected to the circuit element 21. For example, the lower via 30 may be connected a peripheral source/drain 18. The lower connection pattern 36 may penetrate through the second lower insulating layer 33 and may be electrically connected to the lower via 30. The intermediate via 42 may penetrate through the third lower insulating layer 39 and may be electrically connected to the lower connection pattern 36. The intermediate connection pattern 48 may penetrate through the fourth lower insulating layer 45 and may be electrically connected to the intermediate via 42. The upper via 54 may penetrate through the fifth lower insulating layer 51 and may be electrically connected to the intermediate connection pattern 48. The uppermost connection pattern 60 may penetrate through the sixth lower insulating layer 57 and may be electrically connected to the upper via 54.

In some example embodiments, the uppermost connection pattern 60 may have a (e.g., single) damascene structure. For example, forming the uppermost connection pattern 60 of a single damascene structure may include forming an opening penetrating through the sixth lower insulating layer 57 and exposing the upper via 54, forming a conductive material layer filling the opening and covering the sixth lower insulating layer 57, and planarizing the conductive material layer by performing a chemical mechanical polishing process.

The width of the uppermost connection pattern 60 may increase from the lower region to the upper region, between the first and second side surfaces facing each other. Accordingly, the uppermost connection pattern 60 may have an inclined side surface.

The uppermost connection pattern 60 may contact an upper surface of the upper via 54 and a side surface of an upper region of the upper via 54. For example, the conductive barrier layer 59*a* of the uppermost connection pattern 60 may contact an upper surface of the upper via 54 and a side surface of an upper region of the upper via 54. An upper end of the upper via 54 may be disposed on a higher level than a lower surface of the uppermost connection pattern 60.

In the lower insulating structure 75, a portion thereof located on a higher level than the uppermost connection pattern 60 located on the top of the plurality of connection patterns 36, 48 and 60 may include the first insulating layer 66, the capping layer 69 and the second insulating layer 72. The first insulating layer 66 may contact upper surfaces of the uppermost connection patterns 60 and the upper surface of the sixth lower insulating layer 57.

The material of the capping layer 69 may be different from the material of the first insulating layer 66 and the material of the second insulating layer 72. For example, the material of the capping layer 69 may be silicon nitride and/or a silicon nitride-based insulating material, and the material of the first insulating layer 66 and the material of the second insulating layer 72 may be silicon oxide and/or a low dielectric material.

A thickness of the second insulating layer 72 may be greater than a thickness of the capping layer 69. A thickness of the second insulating layer 72 may be greater than a thickness of the first insulating layer 66. A thickness of the first insulating layer 66 may be less than a thickness of the capping layer 69. In another example, the thickness of the first insulating layer 66 may be substantially the same as the thickness of the capping layer 69.

In some examples, the thickness of the capping layer 69 may range from about 150 Å to about 500 Å. For example, the thickness of the capping layer 69 may range from about 300 Å to about 400 Å.

In an example, the thickness of the first insulating layer 66 may be greater than about 10 Å and less than the thickness of the capping layer 69. For example, the thickness of the first insulating layer 66 may be greater than about 30 Å and less than the thickness of the capping layer 69.

The upper structure US may include an upper substrate 103 on the lower insulating structure 75, a first inner insulating layer 106a and a second inner insulating layer 106b penetrating through the upper substrate 103, and an intermediate insulating layer 106c on an outer side surface of the upper substrate 103. The upper substrate 103 may contact an upper surface of the second insulating layer 72.

The upper substrate 103 may include a lower pattern layer 103a, a first intermediate pattern layer 103b1 and a second intermediate pattern layer 103b2 spaced apart from each other on the lower pattern layer 103a, and an upper pattern layer 103c on the lower pattern layer 103a and covering the first and second intermediate pattern layers 103b1 and 103b2. The lower pattern layer 103a may be thicker than each of the first intermediate pattern layer 103b1, the second intermediate pattern layer 103b2, and the upper pattern layer 103c.

At least one of the lower pattern layer 103a, the first intermediate pattern layer 103b1, and/or the upper pattern layer 103c may include a silicon layer. For example, at least one of the lower patterned layer 103a, the first intermediate patterned layer 103b1 and/or the upper patterned layer 103c may include a doped polysilicon layer (for example, a polysilicon layer having an N-type conductivity).

The second intermediate pattern layer 103b2 may include a first material layer, a second material layer, and a third material layer sequentially stacked. In some example embodiments of the second intermediate pattern layer 103b2, the first material layer and the third material layer may be silicon oxide layers, and/or the second material layer may be a silicon nitride layer.

The upper structure US may further include a stack structure GS, and second capping insulating layers 118 and 130 covering at least a portion of the stack structure GS. The stack structure GS may be disposed on the upper substrate 103.

The stack structure GS may include a lower stack structure GSa and an upper stack structure GSb disposed on the lower stack structure GSa. The lower stack structure GSa may include first interlayer insulating layers 109 and first gate layers 112g that are alternately stacked. Among the lower stack structure GSa, an uppermost layer and a lowermost layer may each be a first interlayer insulating layer 109.

The upper stack structure GSb may include second interlayer insulating layers 121 and second gate layers 124g that are alternately stacked. Among the upper stack structure GSb, an uppermost layer and a lowermost layer may each be a second interlayer insulating layer 121. The first and second gate layers 112g and 124g may be referred to as gate electrodes.

The stack structure GS may have a substantially flat upper surface in a memory cell array area MCA on the upper substrate 103, and may have a stepped shape in a step area SA on the upper substrate 103. For example, the first gate layers 112g and the second 124g may be stacked while being spaced apart from each other in a vertical direction Z in the memory cell array area MCA, and may extend from the memory cell array area MCA to the step area SA to have gate pads GP that are arranged in a stepped shape in the step area SA.

In a first through area TA1 in the step area SA, the stack structure GS may include horizontal insulating layers 112ia disposed on the same level as at least a portion of the first and second gate layers 112g and 124g. The horizontal insulating layers 112ia may be formed of silicon nitride. The first through area TA1 may overlap the first inner insulating layer 106a.

The stack structure GS may include horizontal insulating layers 112ib and 124i disposed, respectively, on the same level as at least portions of the first and second gate layers 112g and 124g in a second through area TA2 between the memory cell array areas MCA. The horizontal insulating layers 112ib and 124i may be formed of silicon nitride. The second through area TA2 may overlap the second inner insulating layer 106b.

The upper structure US may further include a first upper insulating layer 151, a second upper insulating layer 157, a third upper insulating layer 169, a fourth upper insulating layer 175, and a fifth upper insulating layer 181, sequentially stacked on the stack structure GS and the second capping insulating layer 130.

The upper structure US may further include vertical memory structures 133 penetrating through the stack structure GS in the memory cell array area MCA. The vertical memory structures 133 may contact the upper substrate 103. Regions of the vertical memory structures 133, facing the gate layers that may be word lines among the first and second gate layers 112g and 124g, may include memory cells configured to store information (e.g., of a memory device). Accordingly, the upper structure US may include memory cells arranged three-dimensionally.

The upper structure US may further include an upper isolation pattern 148 penetrating and dividing one and/or a plurality of second gate layers 124g (e.g., positioned in an upper portion, among the second gate layers 124g, and may, for example, divide and/or isolate string selection lines). The upper isolation pattern 148 may be disposed on a higher level than word lines among the gate layers 124g. The upper isolation pattern 148 may be formed of an insulating material such as silicon oxide.

The upper structure US may further include separation structures 154 penetrating through the first upper insulating layer 151 and the stack structure GS. The vertical memory structures 133 may be disposed between the separation structures 154 adjacent to each other. The separation structures 154 may penetrates through the upper pattern layer 103c and the first intermediate pattern layer 103b1 and may contact the lower pattern layer 103a. In some example embodiments, the separation structures 154 may be formed of and/or include an insulating material such as silicon oxide and/or a high dielectric material.

In some example embodiments, some and/or each of the separation structures 154 may include a conductive pattern and an insulating material layer covering side surfaces of the conductive pattern.

The upper structure US may further include contact plugs 166 in contact with the gate pads GP and extending upwardly in the step area SA, and penetrating through the first and second upper insulating layers 151 and 157. For example, in the step area SA, the upper structure US may include the gate contact plugs 166 contacting the gate pads GP, extending upwardly and penetrating through the first and second upper insulating layers 151 and 157.

The upper structure US may further include a source contact plug 163 spaced apart from the first and second gate layers 112g and 124g and in contact with the lower pattern layer 103a of the upper substrate 103.

In some example embodiments, as the uppermost connection pattern 60 (e.g., of the lower structure LS) a plurality of uppermost connection patterns may be disposed. For example, the plurality of upper connection patterns 60 may include a first upper connection pattern 60a, a second upper connection pattern 60b, and a third upper connection pattern 60c. The first upper connection pattern 60a may be disposed below the intermediate insulating layer 106c, the second upper connection pattern 60b may be disposed below the first inner insulating layer 106a, and the third upper connection pattern 60c may be disposed below the second inner insulating layer 106b.

The semiconductor device 1 may further include peripheral contact plugs 160 in contact with the plurality of uppermost connection patterns 60 and electrically connected thereto, and at least penetrating through a portion of the lower insulating structure 75 positioned on a higher level than the plurality of uppermost connection patterns 60. The portion of the lower insulating structure 75 positioned on a higher level than the plurality of uppermost connection patterns 60 (e.g., the portion of the lower insulating structure 75 through which the peripheral contact plugs 160 may penetrate) may include the first insulating layer 66, the capping layer 69 and the second insulating layer 72. Upper surfaces of the peripheral contact plugs 160 may be disposed on a higher level than an uppermost gate layer among the first and second gate layers 112g and 124g, and lower surfaces of the peripheral contact plugs 160 may contact and/or partially penetrate the uppermost connection patterns 60.

For example, the peripheral contact plugs 160 may penetrate through portions of the lower insulating structure 75 positioned on a higher level than the plurality of uppermost connection patterns 60. In some example embodiments, the peripheral contact plugs 160 may penetrate through the first insulating layer 66, the capping layer 69, and the second insulating layer 72 and may extend upwardly. Each of the peripheral contact plugs 160 may have an upper surface disposed on a level higher than that of an uppermost gate layer among the first and second gate layers 112g and 124g, and may have a lower surface lower than that of a lowermost gate layer among the first and second gate layers 112g and 124g. The peripheral contact plugs 160 may include a conductive material pattern and a conductive barrier layer covering side and bottom surfaces of the conductive material pattern. For example, the peripheral contact plugs 160 may include a metal material pattern 159b and a conductive barrier layer 159a covering side and bottom surfaces of the metal material pattern 159b.

The peripheral contact plugs 160 may include a first peripheral contact plug 160a in contact with the first upper connection pattern 60a, a second peripheral contact plug 160b in contact with the second upper connection pattern 60b, and a third peripheral contact plug 160c in contact with the third upper connection pattern 60c.

In some example embodiments, the peripheral contact plugs 160 may extend into the uppermost connection patterns 60. In these cases, by increasing the contact area between the peripheral contact plugs 160 and the uppermost connection patterns 60, the contact resistance characteristic may be improved.

A height difference between a lower end of the first peripheral contact plug 160a and an upper end of the first upper connection pattern 60a may be greater than a thickness of the first insulating layer 66. The height difference between a lower end of the first peripheral contact plug 160a and an upper end of the first upper connection pattern 60a may be greater than a thickness of the capping layer 69. For example, the depth of the first peripheral contact plug 160a in the first upper connection pattern 60a may be greater than the thickness of the first insulating layer 66, the capping layer 69, and/or the first insulating layer 66 and the capping layer 69.

A peripheral contact plug (e.g., the first peripheral contact plug 160a) may penetrate through the intermediate insulating layer 106c, the first and second capping insulating layers 118 and 130, and the first and second upper insulating layers 151 and 157. Another peripheral contact plug (e.g., the second peripheral contact plug 160b) may penetrate through the first inner insulating layer 106a and the first through area TA1 to extend upwardly and penetrate through the first and second upper insulating layers 151 and 157. A third peripheral contact plug 160c may penetrate through the second inner insulating layer 106b and the second through area TA2 to extend upwardly and penetrate through the first and second upper insulating layers 151 and 157.

The upper structure US may further include a bit line 178a, a peripheral connection interconnection 178b, a gate connection interconnection 178c and a source connection interconnection 178d, penetrating through the fourth upper insulating layer 175.

The upper structure US may further include a first peripheral upper contact plug 172b electrically connecting the first peripheral contact plug 160a and the peripheral connection interconnection 178b, a second peripheral upper contact plug 172c electrically connecting the second peripheral contact plug 160b and the gate interconnection 178c, and a third peripheral upper contact plug 172c electrically connecting the third peripheral contact plug 160c and the bit line 178a. For example, the first peripheral upper contact plug 172b may be between the first peripheral contact plug 160a and the peripheral connection interconnection 178b; the second peripheral contact plug 160b may be between the second peripheral contact plug 160b and the gate interconnection 178c; and/or the third peripheral upper contact plug 172c may be between the third peripheral contact plug 160c and the bit line 178a.

The upper structure US may further include a bit line contact plug 172a electrically connecting the bit line 178a and the vertical memory structure 133, a gate upper contact plug 172f electrically connecting the gate contact plug 166 and the gate interconnection 178c, and a source upper contact plug 172e electrically connecting the source contact plug 163 and the source interconnection 178d. For example, the bit line contact plug 172a may be between the bit line 178a and the vertical memory structure 133; the gate upper contact plug 172f may be between the gate contact plug 166 and the gate interconnection 178c; and/or the source upper contact plug 172e may be between the source contact plug 163 and the source interconnection 178d.

The first insulating layer 66, the capping layer 69, and/or the second insulating layer 72, described above, may reduce and/or prevent the uppermost connection patterns 60 from being deformed and/or damaged due to heat generated during a semiconductor process of forming the upper structure US. For example, the upper substrate 103 and/or the vertical memory structure 133 may include a doped silicon layer doped with impurities, and a high-temperature semiconductor process, such as annealing for activating impurities in the doped silicon layer may be performed to form the upper substrate 103 and/or the vertical memory structure 133, and the first insulating layer 66, the capping layer 69, and/or the second insulating layer 72 may reduce and/or prevent the uppermost connection patterns 60 from being deformed and/or damaged during the annealing.

Accordingly, the first insulating layer 66, the capping layer 69, and the second insulating layer 72, described above, may improve reliability of the semiconductor device 1.

Furthermore, by disposing the first insulating layer 66, which may be formed of silicon oxide, between the capping layer 69 and the uppermost connection patterns 60, leakage current between the uppermost connection patterns 60 adjacent to each other may be prevented and/or mitigated from occurring.

Accordingly, by forming the portion of the lower insulating structure 75 positioned on a higher level than the uppermost connection patterns 60 as the first insulating layer 66, the capping layer 69 and the second insulating layer 72 that are sequentially stacked; the distance between the uppermost connection patterns 60 may be reduced, and thus the degree of integration of the circuit interconnection structure 63 may be improved.

Since the degree of integration of the circuit interconnection structure 63 is increased, the degree of integration of the semiconductor device 1 may be improved.

Figure 3:
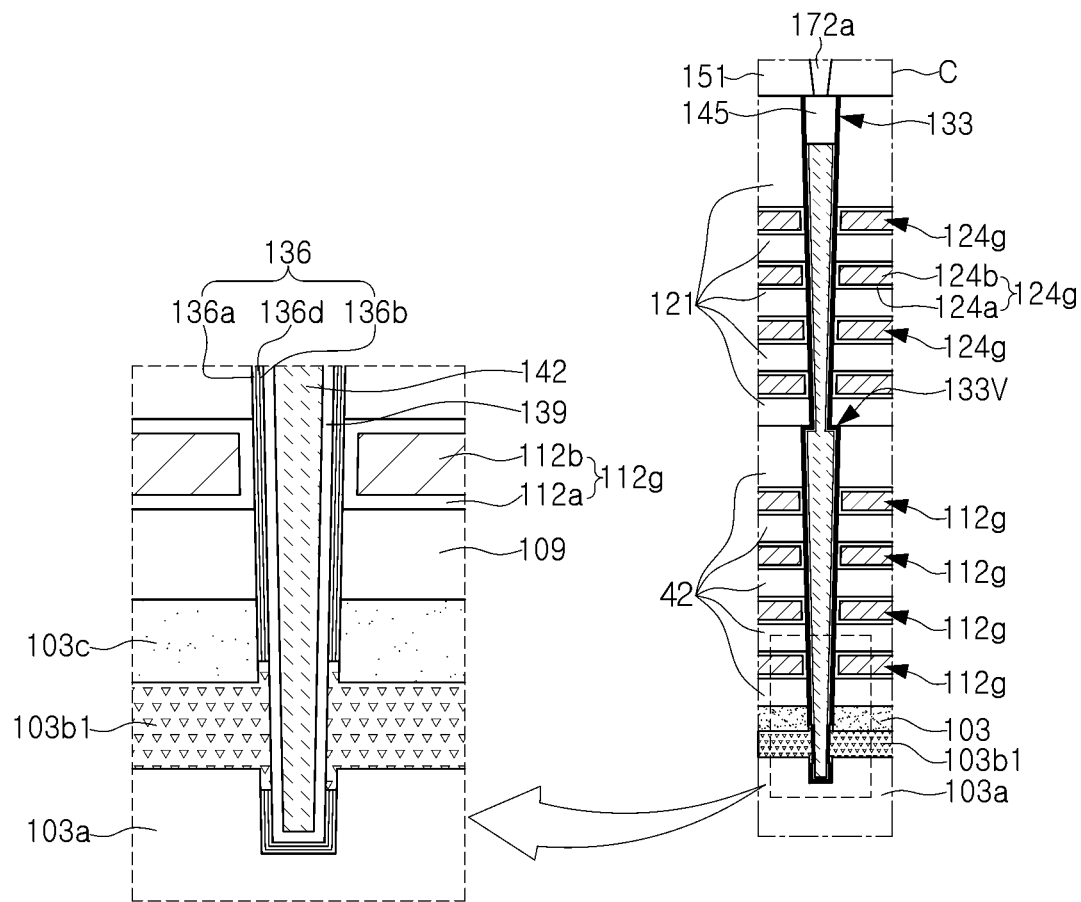
FIG. 3 is a schematic partially enlarged cross-sectional view illustrating an example of a semiconductor device according to some example embodiments.

Next, with reference to FIG. 3, some examples of the vertical memory structure 133, the upper substrate 103, the first gate layers 112g, and the second gate layers 124g will be described. FIG. 3 is an enlarged view of a portion marked with 'C' of FIG. 1A.

Referring to FIG. 3, the vertical memory structure 133 may include an insulating core pattern 142, a channel layer 139 covering side and bottom surfaces of the insulating core pattern 142, a pad pattern 145 disposed on the insulating core pattern 142 and in contact with the channel layer 139, and an information storage structure 136 covering at least an outer surface of the channel layer 139. The information storage structure 136 may include a first dielectric layer 136a, a second dielectric layer 136b, and an information storage layer 136d between the first and second dielectric layers 136a and 136b. The second dielectric layer 136b may be interposed between the information storage layer 136d and the channel layer 139.

In some embodiments, the insulating core pattern 142 may include silicon oxide. For example, the silicon oxide may have been formed by an atomic layer deposition process, and/or the silicon oxide may have voids formed therein. The second dielectric layer 136b may include silicon oxide and/or silicon oxide doped with impurities. The first dielectric layer 136a may include at least one of silicon oxide and/or a high dielectric. The information storage layer 136d may include a material capable of storing information, e.g., by trapping a charge. For example, in some embodiments the information storage layer 136d may include silicon nitride. The information storage layer 136d may include regions configured to store information in a semiconductor device such as a flash memory device (for example, memory cells). The channel layer 139 may include a silicon layer (for example, an undoped silicon layer). The pad pattern 145 may include at least one of doped polysilicon, metal nitride (e.g., TiN, and/or the like), metal (e.g., W and/or the like), and/or a metal-semiconductor compound (e.g., TiSi and/or the like.). The bit line contact plug 172a may contact and/or be electrically connected to the pad pattern 145 of the vertical memory structure 133.

In a portion of the vertical memory structure 133 extending into the upper substrate 103, the first intermediate pattern layer 103b1 may penetrate through the information storage structure 136 and contact the channel layer 139, and the information storage structure 136 may be divided into upper and lower portions by the first intermediate pattern layer 103b1. In some embodiments, the first intermediate pattern layer 103b1 may include a silicon layer having an N-type conductivity.

Between an uppermost first gate layer of the first gate layers 112g and a lowermost second gate layer of the second gate layers 124g, the vertical memory structure 133 may include a side slope change portion 133V. The side slope change portion 133V may indicate a part in which the inclination changes between the adjacent upper side surface and the adjacent lower side surface. For example, the side slope change portion 133V may refer to a side portion having a gentle slope between a steep upper side surface and a steep lower side surface.

Each of the first gate layers 112g may include a first layer 112a and a second layer 112b. Each of the second gate layers 124g may include a third layer 124a and a fourth layer 124b. The first layer 112a may cover upper and lower surfaces of the second layer 112b and may extend between the vertical memory structure 133 and the second layer 112b. The third layer 124a may cover upper and lower surfaces of the fourth layer 124b and may extend between the vertical memory structure 133 and the fourth layer 124b.

In some example embodiments, the first and third layers 112a and 124a may include a dielectric material, and the second and fourth layers 112b and 124b may include a conductive material. For example, the first and third layers 112a and 124a may include a high-k dielectric such as AlO and/or the like, and the second and fourth layers 112b and 124b may include a conductive material such as TiN, WN, Ti, W, and/or the like.

In some example embodiments, the first and third layers 112a and 124a may include a first conductive material (e.g., TiN, W and/or the like), and the second and fourth layers 112b and 124b may include a second conductive material (e.g., Ti, W, and/or the like) different from the first conductive material.

In some example embodiments, the first and second gate layers 112g and 124g may be formed of a doped polysilicon, a metal-semiconductor compound (e.g., TiSi, TaSi, CoSi, NiSi, or WSi), a metal nitride (e.g., TiN, TaN, or WN), and/or a metal (e.g., Ti or W).

Next, various modifications of some components of a semiconductor device according to some example embodiments will be described with reference to FIGS. 4 to 8, respectively. FIGS. 4 to 8 are partial enlarged views illustrating modified examples of some components of the semiconductor device 1 described with reference to FIGS. 1A to 2B, and are partially enlarged views that may represent an area corresponding to the part indicated by 'A' in FIG. 1A. Hereinafter, various modifications of the semiconductor device according to some example embodiments described with reference to FIGS. 4 to 8 may be applied to the cross-sectional structures of FIGS. 1A and 1B, even if there is no separate description.

Figure 4:
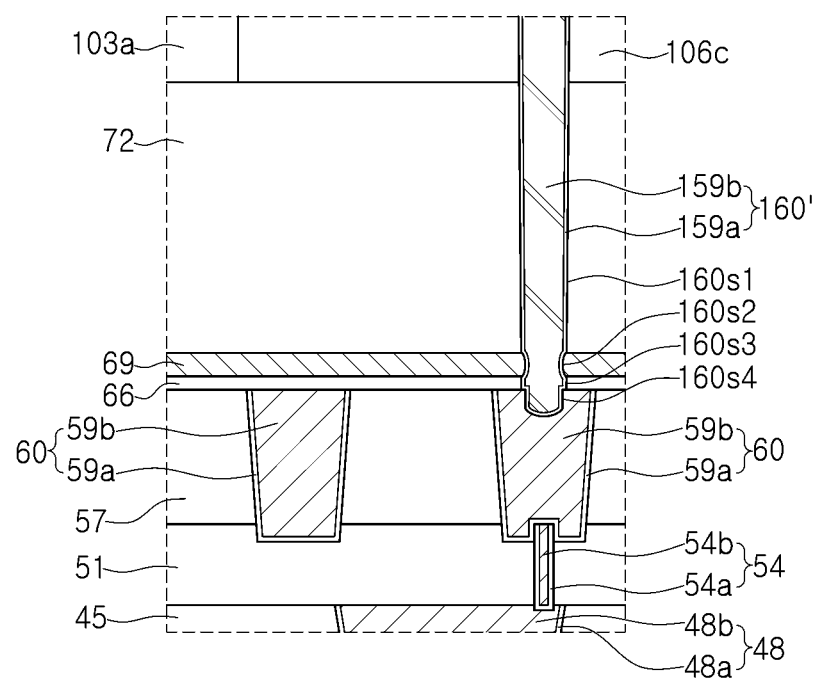
FIG. 4 is a schematic partially enlarged cross-sectional view illustrating a modified example of a semiconductor device according to some example embodiments.

In a modified example, the peripheral contact plugs described above (for example, the peripheral contact plug 160 in FIG. 2A) may be transformed into a peripheral contact plug 160' as in FIG. 4. The peripheral contact plug 160' may include a first portion 160s1 penetrating through the second insulating layer 72, a second portion 160s2 penetrating through the capping layer 69, a third portion 160s3 penetrating through the first insulating layer 66, and a fourth portion 160s4 extending into the uppermost connection pattern 60 and contacting the uppermost connection pattern 60. In this case, the fourth portion 160s4 may be defined as a portion in contact with the uppermost connection pattern 60 at a level at and/or lower than the upper surface of the uppermost connection pattern 60. In the peripheral contact plug 160', the first portion 160s1 may be defined as a portion in and/or in contact with the second insulating layer 72, the second portion 160s2 may be defined as a portion in and/or in contact with the capping layer 69, and the third portion 160s3 may be defined as a portion in and/or in contact with the first insulating layer 66.

In the peripheral contact plug 160', a maximum width of the first portion 160s1 may be greater than a minimum width of the second portion 160s2.

In the peripheral contact plug 160', the maximum width of the first portion 160s1 may be greater than a minimum width of the fourth portion 160s4.

In the peripheral contact plug 160', a maximum width of the third portion 160s3 may be greater than a minimum width of the second portion 160s2.

In the peripheral contact plug 160', the maximum width of the third portion 160s3 may be greater than the minimum width of the fourth portion 160s4.

In the peripheral contact plug 160', a maximum width of the fourth portion 160s4 may be less than the maximum width of the third portion 160s3.

A height difference between the lower end of the fourth portion 160s4 of the peripheral contact plug 160' and an upper end of the uppermost connection pattern 60 may be greater than the thickness of the first insulating layer 66. For example, a distance the fourth portion 160s4 penetrates into the uppermost connection pattern 60 may be greater than the thickness of the first insulating layer 66.

A height difference between the lower end of the fourth portion 160s4 of the peripheral contact plug 160' and an upper end of the uppermost connection pattern 60 may be greater than the thickness of the capping layer 69. For example, a distance the fourth portion 160s4 penetrates into the uppermost connection pattern 60 may be greater than the thickness of the capping layer 69.

In the peripheral contact plug 160', a side surface of the second portion 160s2 may have a concave shape compared to the side surfaces of the first portion 160s1 and/or the third portion 160s3.

In the peripheral contact plug 160', a lateral inclination of the second portion 160s2 may be different from a lateral inclination of the first portion 160s1.

In the peripheral contact plug 160', a side surface of the second portion 160s2 may have a curved shape, and a side surface of the first portion 160s1 may have a substantially straight shape.

Hereinafter, unless otherwise described, the peripheral contact plug may be the peripheral contact plug 160 in FIG. 2A or the peripheral contact plug 160' in FIG. 4.

Figure 5:
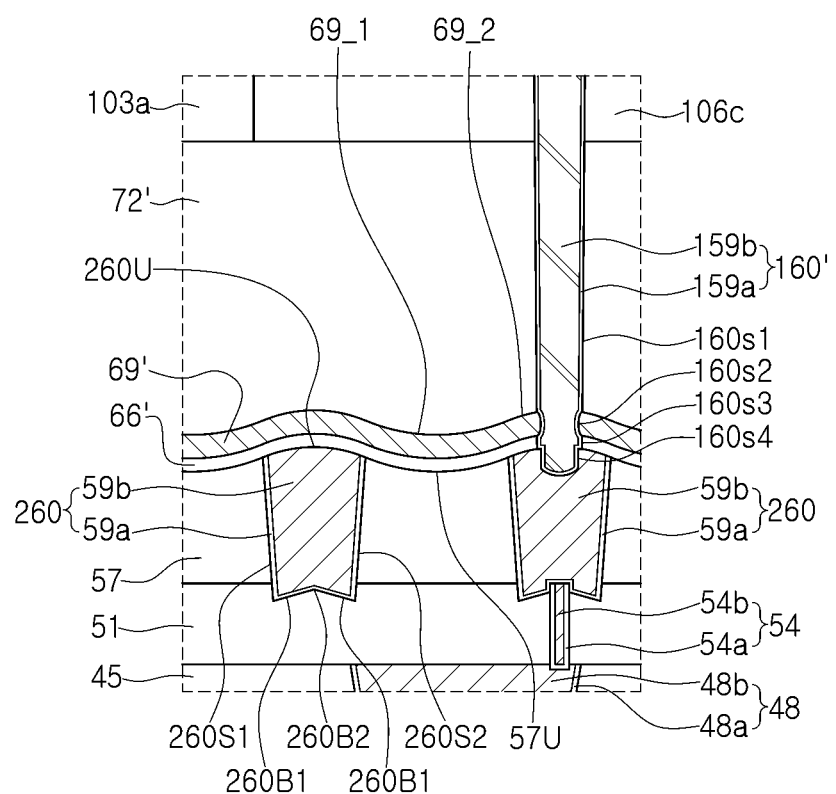
FIG. 5 is a schematic partially enlarged cross-sectional view illustrating a modified example of a semiconductor device according to some example embodiments.

In a modified example, the uppermost connection pattern described above (for example, the uppermost connection pattern 60 in FIG. 2A) may be transformed into an uppermost connection pattern 260 as in FIG. 5. An upper surface 260U of the uppermost connection pattern 260 may extend from upper ends of a first side surface 260S1 and a second side surface 260S2 that oppose each other, and at least a portion of the upper surface 260U of the uppermost connection pattern 260 may be curved. For example, the upper surface 260U of the uppermost connection pattern 260 may have a convex shape.

By forming the upper surface 260U of the uppermost connection pattern 260 in a convex shape, the overall volume of the uppermost connection pattern 260 may be increased and resistance characteristics may be improved.

As illustrated in FIG. 5, the peripheral contact plug 160' may include a first portion 160s1 penetrating through the second insulating layer 72', a second portion 160s2 penetrating through the capping layer 69', a third portion 160s3 penetrating through the first insulating layer 66', and a fourth portion 160s4 penetrating through a portion of the upper surface 260U of the uppermost connection pattern 260, extending into the uppermost connection pattern 260 and contacting the uppermost connection pattern 260. A lower end of the peripheral contact plug 160' may be disposed on a level lower than an upper end of the uppermost connection pattern 260.

The uppermost connection pattern 260 may have lower surfaces 260B1 and 260B2 including portions extending from the first and second side surfaces 260S1 and 260S2 of the uppermost connection pattern 260. The first and second side surfaces 260S1 and 260S2 of the uppermost connection pattern 260 may be inclined side surfaces in which widths increase from the lower region to the upper region. The lower surfaces 260B1 and 260B2 of the uppermost connection pattern 260 may include a region positioned on a level higher than lower ends of the first and second side surfaces 260S1 and 260S2.

The lower surfaces 260B1 and 260B2 of the uppermost connection pattern 260 may, respectively, include a portion that extends from the first and second side surfaces 260S1 and 260S2 of the uppermost connection pattern 260 while forming an acute angle.

The lower surfaces 260B1 and 260B2 of the uppermost connection pattern 260 may include first portions 260B1 adjacent to the first and second side surfaces 260S1 and 260S2 of the uppermost connection pattern 260, and the second portion 260B2 between the first portions 260B1. In the case of the lower surfaces 260B1 and 260B2 of the uppermost connection pattern 260, lower ends of the first portions 260B1 may be disposed on a level lower than that of the second portion 260B2. In the lower surfaces 260B1 and 260B2 of the uppermost connection pattern 260, the first portions 260B1 may be edge portions, and the second portion 260B2 may be a central portion.

An upper surface 57U of the sixth lower insulating layer 57 may be flat and/or concave.

The capping layer 69 described above may be transformed into a capping layer 69' having a wavy shaped upper surface as in FIG. 5. For example, the capping layer 69' may include a first capping insulating region 69_1 having a first upper surface, and a second capping insulating region 69_2 having a second upper surface higher than the first upper surface. In the capping layer 69', the first upper surface of the first capping insulating region 69_1 may have a concave shape, and the second upper surface of the second capping insulating region 69_2 may have a convex shape.

The second capping insulating region 69_2 may overlap the uppermost connection pattern 260. The peripheral contact plug 160' may penetrate through a portion of the second capping insulating region 69_2 of the capping layer 69' and contact the uppermost connection pattern 260.

The first insulating layer 66 described above may be transformed into a first insulating layer 66' having a wavy shaped upper surface as in FIG. 5.

The second insulating layer 72 described above may be transformed into a second insulating layer 72' having a lower surface having a wavy shape as in FIG. 5. An upper surface of the second insulating layer 72' may be substantially flat.

Figure 6:
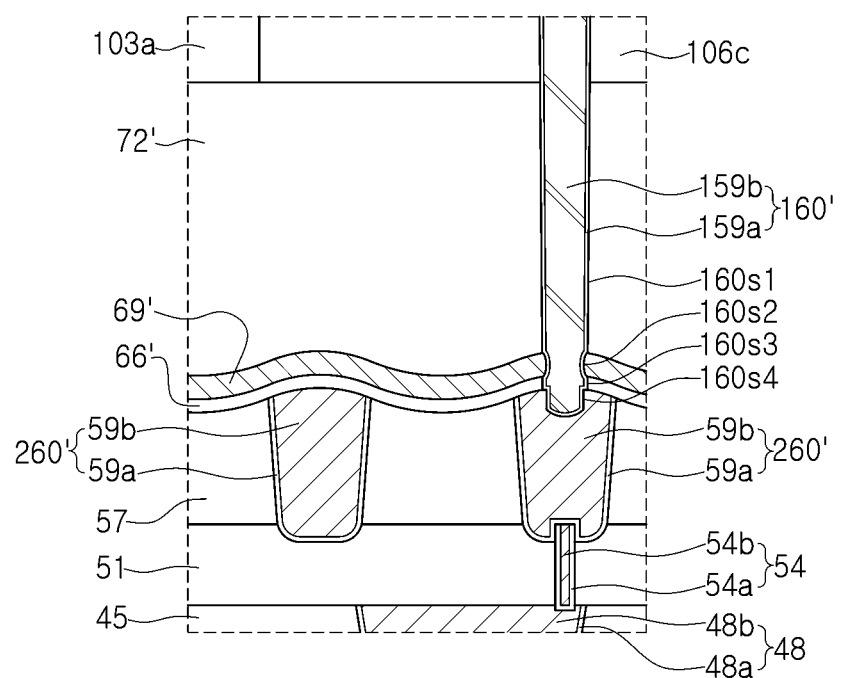
FIG. 6 is a schematic partial enlarged cross-sectional view illustrating a modified example of a semiconductor device according to some example embodiments.

In a modified example, the uppermost connection pattern described above (for example, the uppermost connection pattern 60 in FIG. 2A and/or 260 in FIG. 5) may be transformed into an uppermost connection pattern 260' as in FIG. 6. For example, the lower surface of the uppermost connection pattern 260' may including a downward convex shape. The upper via 54 may penetrate through a portion of the lower surface of the uppermost connection pattern 260' and may extend into the uppermost connection pattern 260'.

Figure 7:
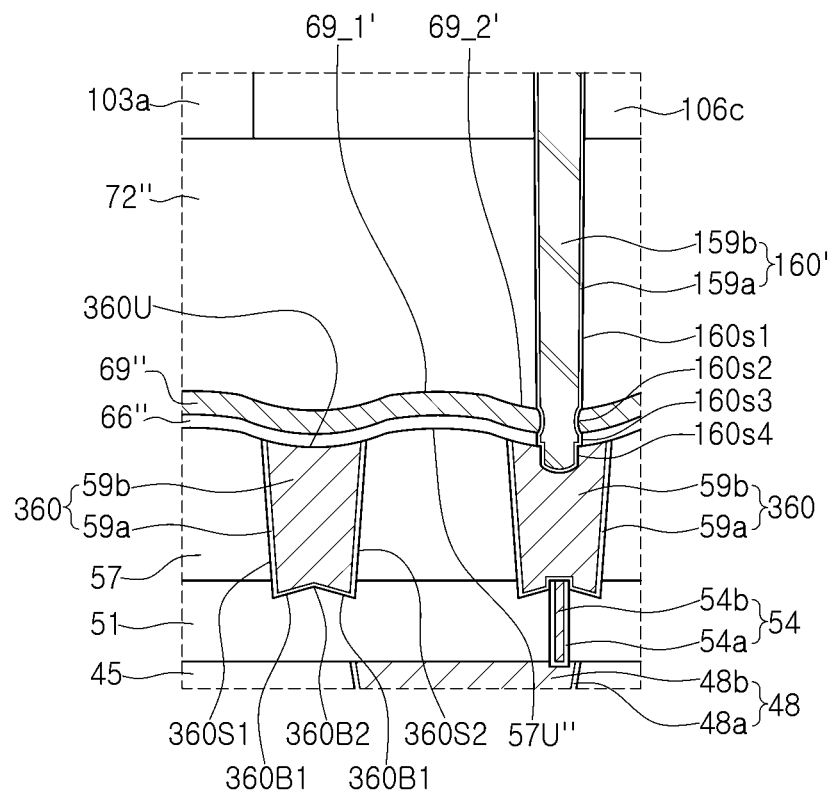
FIG. 7 is a schematic partially enlarged cross-sectional view illustrating a modified example of a semiconductor device according to some example embodiments.

In a modified example, the uppermost connection pattern described above (for example, the uppermost connection pattern 60 in FIG. 2A and/or 260 in FIG. 5) described above may be transformed into an uppermost connection pattern 360 as in FIG. 7. For example, the uppermost connection pattern 360 may have a concave upper surface 360U. The upper surface 360U of the uppermost connection pattern 360 may be concave while extending from upper ends of the first side surface 360S1 and the second side surface 360S2 opposing each other.

By forming the upper surface 360U of the uppermost connection pattern 360 to have a concave shape, a leakage current and/or an electric short between adjacent uppermost connection patterns may be mitigated and/or prevented.

The lower surfaces 360B1 and 360B2 of the uppermost connection pattern 360 may have substantially the same shape as the lower surfaces 260B1 and 260B2 of the uppermost connection pattern (260 of FIG. 5) as described with reference to FIG. 5.

An upper surface 57U" of the sixth lower insulating layer 57 may be flat and/or convex.

The capping layer 69 described above may be transformed into a capping layer 69" having a wavy-shaped upper surface as illustrated in FIG. 7. For example, the capping layer 69" may include a first capping insulating region 69_1' having a first upper surface, and a second capping insulating region 69_2' having a second upper surface on a lower level than the first upper surface. In the capping layer 69", the first upper surface of the first capping insulating region 69_1' may be convex, and the second upper surface of the second capping insulating region 69_2' may be concave.

The second capping insulating region 69_2' may overlap the uppermost connection pattern 360. The peripheral contact plug 160' may penetrate through a portion of the second capping insulating region 69_2' of the capping layer 69" and may contact the uppermost connection pattern 360.

The first insulating layer 66 described above may be transformed into a first insulating layer 66" having a wavy-shaped upper surface as in FIG. 7.

The second insulating layer 72 described above may be transformed into a second insulating layer 72" having a lower surface having a wavy shape as illustrated in FIG. 7. An upper surface of the second insulating layer 72" may be substantially flat.

Figure 8:
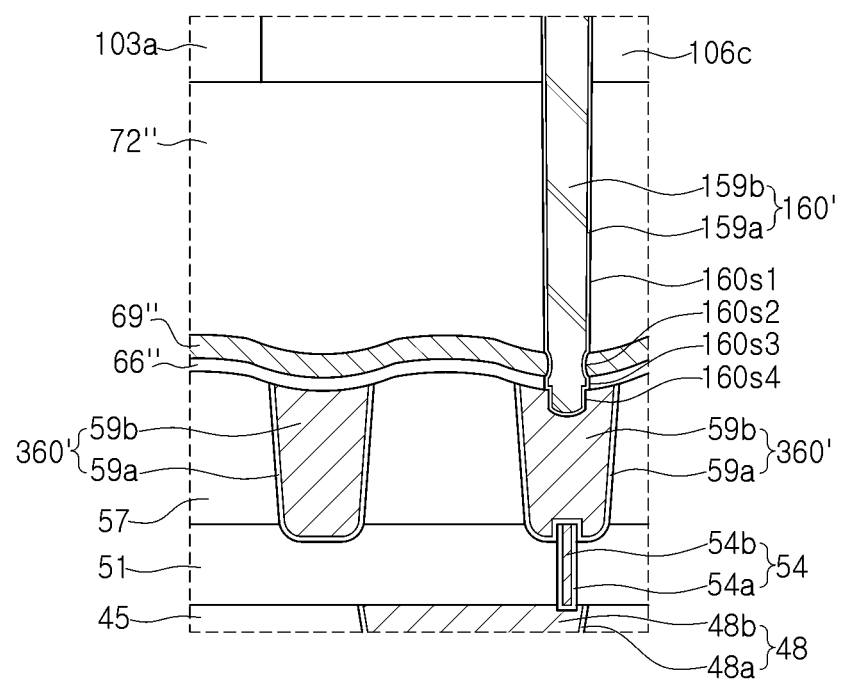
FIG. 8 is a partially enlarged cross-sectional view illustrating a modified example of a semiconductor device according to some example embodiments.

In a modified example, the uppermost connection pattern described above (for example, the uppermost connection pattern 360 in FIG. 7) may be transformed into an uppermost connection pattern 360' as in FIG. 8. For example, the lower surface of the uppermost connection pattern 360' may have a shape convex downwardly. The upper via 54 may penetrate through a portion of a lower surface of the uppermost connection pattern 360' and may extend into the uppermost connection pattern 360'.

Figure 9:
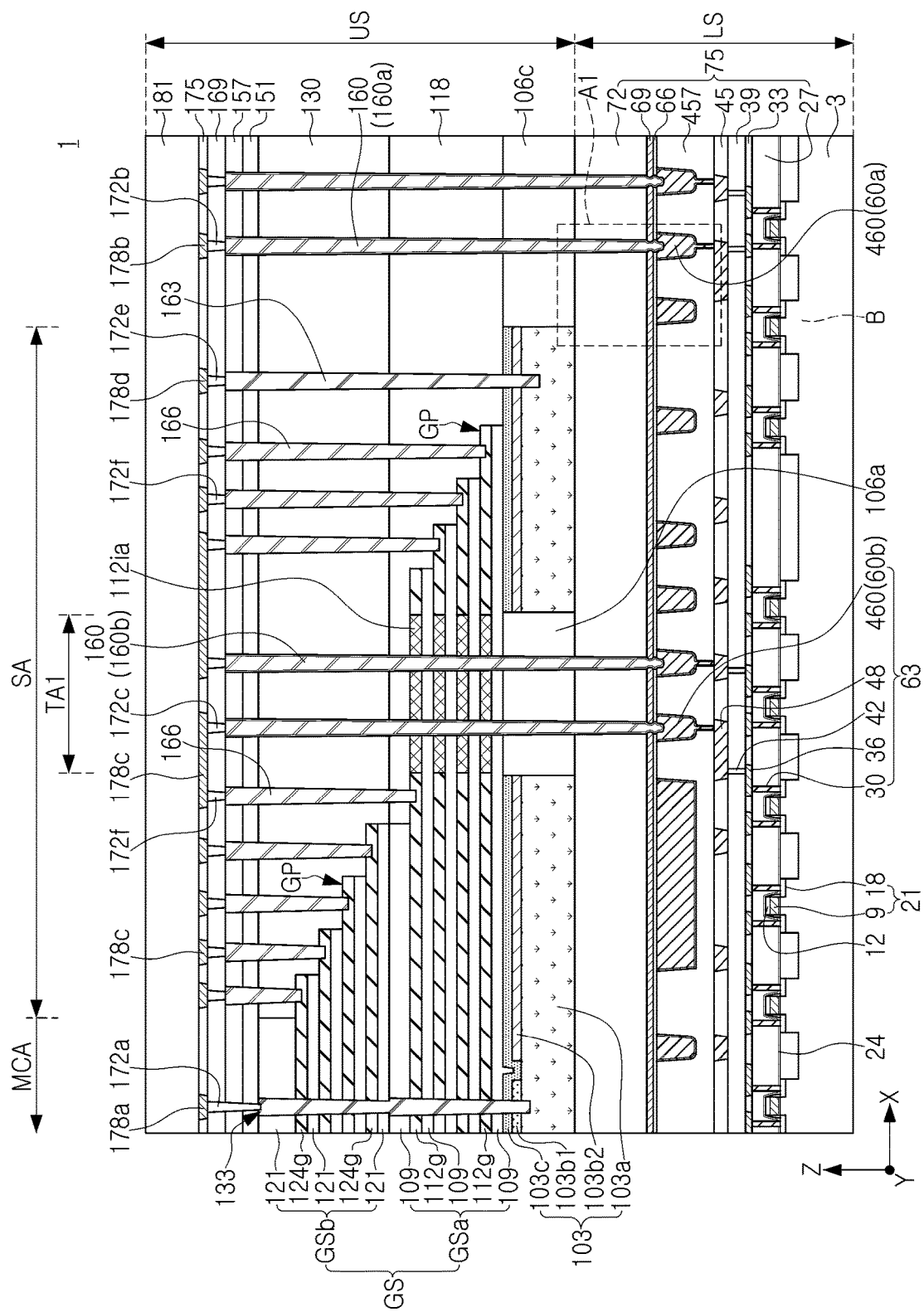
FIGS. 9 and 10 are schematic views illustrating a modified example of a semiconductor device according to some example embodiments.

Next, a modified example of the semiconductor device 1 according to some example embodiments will be described with reference to FIGS. 9 and 10. FIG. 9 is a cross-sectional view corresponding to FIG. 1A, and illustrates a portion transformed from that in FIG. 1A, and FIG. 10 is a partial enlarged view of an area indicated by 'A1' of FIG. 9.

Figure 10:
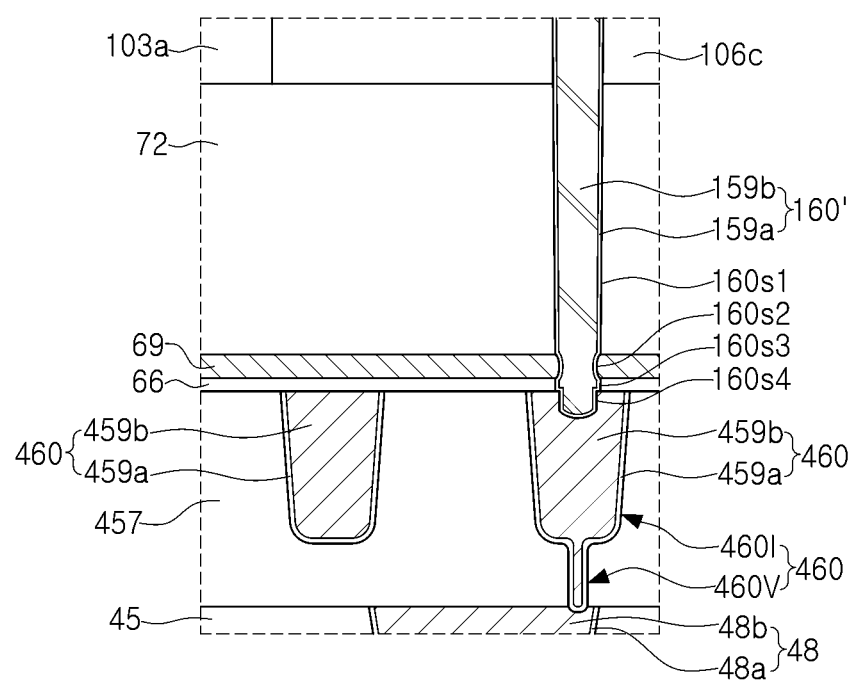

In a modified example, referring to FIGS. 9 and 10, the uppermost connection pattern (e.g., the uppermost connection 60 in FIGS. 1A, 1B and 2A) of the single damascene structure described above and the upper via (e.g. the upper via 54 of FIGS. 1A, 1B and 2A) of the single damascene structure may be transformed into a structure 460 formed as a dual damascene structure as illustrated in FIGS. 9 and 10. For example, the structure 460 may include an uppermost connection pattern 460I and an upper via 460V extending from a portion of the uppermost connection pattern 460I. The structure 460 may include a conductive material pattern 459b and a conductive barrier layer 459a covering side and bottom surfaces of the conductive material pattern 459b. Accordingly, the uppermost connection pattern 460I and the upper via 460V may be integrally formed. The conductive material pattern 459b may be and/or include, for example, a metal material pattern.

In some examples, the fifth and sixth lower insulating layers 51 may be formed of one lower insulating layer 457.

Figure 11:
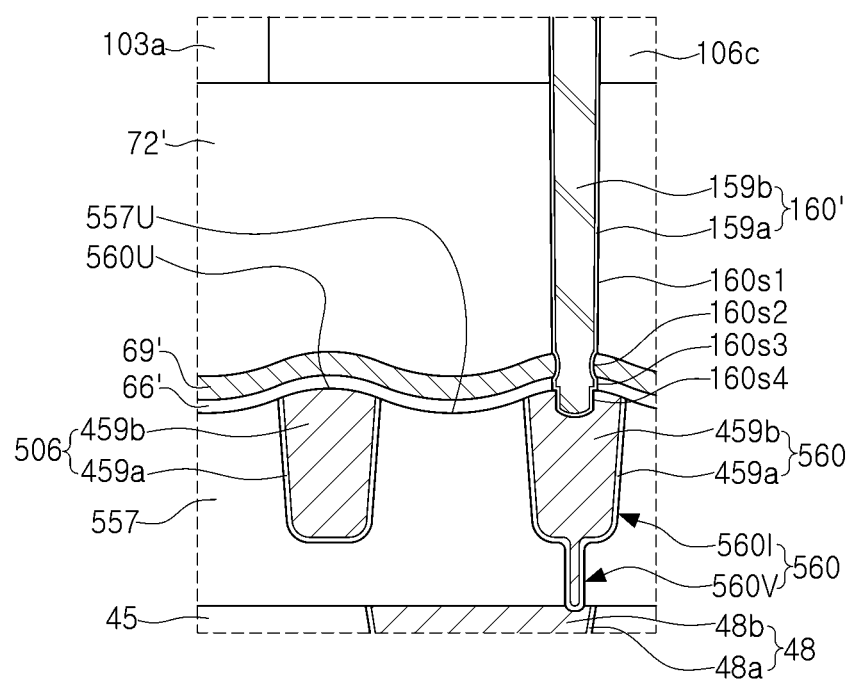
FIG. 11 is a schematic partially enlarged cross-sectional view illustrating a modified example of a semiconductor device according to some example embodiments.
Figure 12:
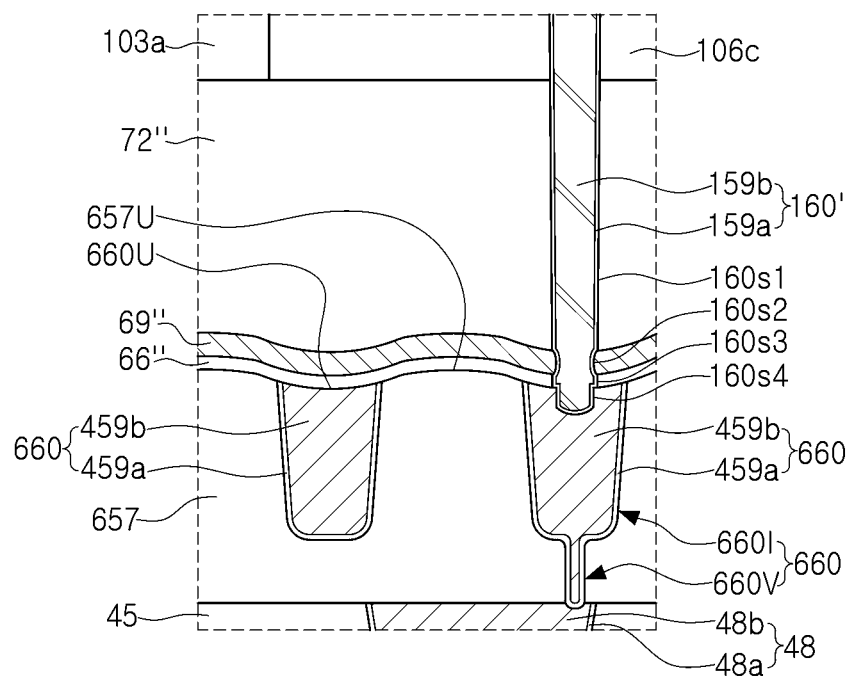
FIG. 12 is a partially enlarged cross-sectional view illustrating a modified example of a semiconductor device according to some example embodiments.

The upper surface of the structure 460 including the uppermost connection pattern 460I and the upper via 460V that are integrally formed, for example, the upper surface of the uppermost connection pattern 460I, may be variously deformed. Hereinafter, various modifications of the upper surface of the uppermost connection pattern 460I will be described with reference to FIGS. 11 and 12, respectively. FIGS. 11 and 12 are schematic partial enlarged views respectively illustrating a portion modified in FIG. 10.

In a modified example, referring to FIG. 11, in a structure 560 including the uppermost connection pattern 560I and the upper via 560V that are integrally formed, an upper surface 560U of the uppermost connection pattern 560I may have substantially the same shape as the upper surface 260U of the uppermost connection pattern 260 of FIG. 5 described with reference to FIG. 5. For example, the upper surface 560U of the uppermost connection pattern 560I may have an upwardly convex shape.

An upper surface 557U of an insulating layer 557 surrounding the side surface of the structure 560 may have a concave shape.

The first insulating layer 66', the capping layer 69' and the second insulating layer 72' substantially identical to those described in FIG. 5 may be disposed on the structure 560 and the insulating layer 557. Also, the peripheral contact plug 160' may be substantially the same as that described with reference to FIG. 5 and may contact and/or partially penetrate the uppermost connection pattern 560I.

In a modified example, referring to FIG. 12, in a structure 660 including an uppermost connection pattern 660I and the upper via 660V that are integrally formed, an upper surface 660U of the uppermost connection pattern 660I may have substantially the same shape as the upper surface 360U of the uppermost connection pattern 360 described with reference to FIG. 7. For example, the upper surface 660U of the uppermost connection pattern 660I may have a concave shape. An upper surface 657U of an insulating layer 657 surrounding the side surface of the structure 660 may have a convex shape.

The first insulating layer 66", the capping layer 69" and the second insulating layer 72" substantially identical to those described in FIG. 7 may be disposed on the structure 660 and the insulating layer 657. In addition, the peripheral contact plug 160', which is substantially the same as that described with reference to FIG. 7, may contact the uppermost connection pattern 6601.

Figure 13:
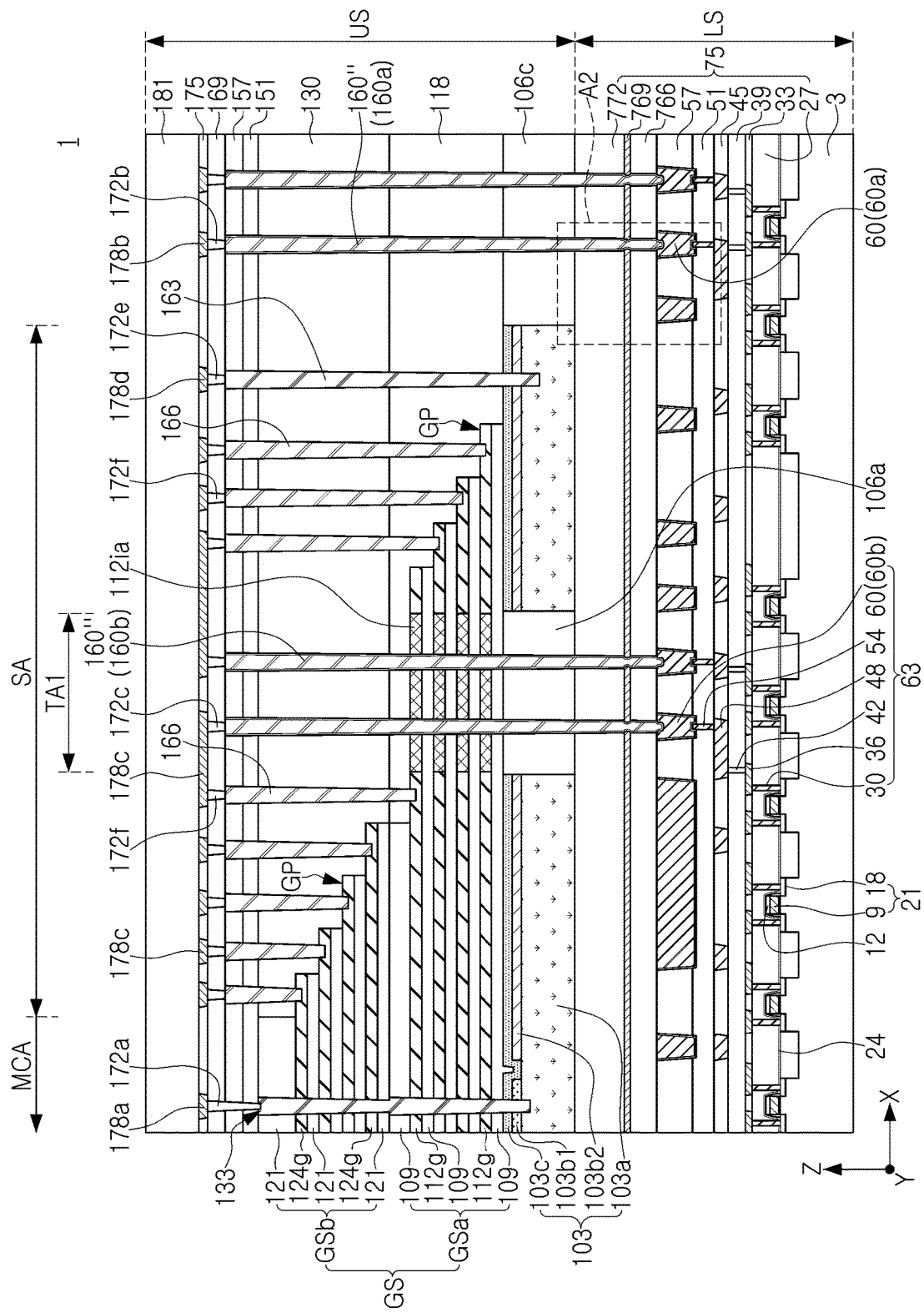
FIGS. 13 and 14 are schematic views illustrating a modified example of a semiconductor device according to some example embodiments.

Next, a modified example of the semiconductor device 1 according to some example embodiments will be described with reference to FIGS. 13 and 14. FIG. 13 is a cross-sectional view corresponding to FIG. 1A, and illustrates a portion deformed from that in FIG. 1A, and FIG. 14 is a partial enlarged view of an area indicated by 'A2' of FIG. 13.

Figure 14:
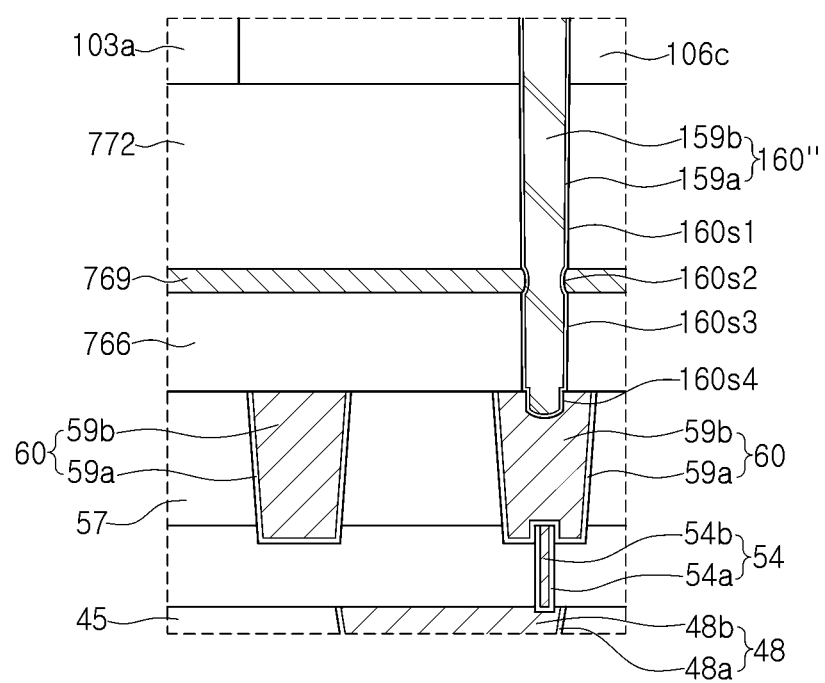

In a modified example, referring to FIGS. 13 and 14, the first insulating layer (e.g., the first insulating layer 66 in FIGS. 1A to 2A), the capping layer (e.g., the capping layer 69 in FIGS. 1A to 2A) and/or the second insulating layer (e.g., the second insulating layer 72 of FIGS. 1A to 2A) described above may be transformed into a first insulating layer 766, a capping layer 769, and/or a second insulating layer 772 as in FIGS. 13 and 14.

The second insulating layer 772 may have a thickness greater than a thickness of each of the first insulating layer 766 and the capping layer 769. The first insulating layer 766 may have a thickness greater than a thickness of the capping layer 769. In some example embodiments, the first insulating layer 766 may have a thickness substantially equal to the thickness of the capping layer 769.

In some example embodiments, the thickness of the capping layer 769 may range from about 150 Å to about 500 Å.

In some example embodiments, the thickness of the capping layer 769 may range from about 300 Å to about 400 Å.

The above-described peripheral contact plug (e.g., the peripheral contact plugs 160 in FIG. 2 and/or 160' in FIG. 4) may be transformed into a peripheral contact plug 160" penetrating through the first insulating layer 766, the capping layer 769, and the second insulating layer 772 as in FIGS. 13 and 14. The peripheral contact plug 160" may include a first portion 160s1 penetrating through the second insulating layer 72 may include a first portion 160s1 penetrating through the second insulating layer 72, a second portion 160s2 penetrating through the capping layer 69, a third portion 160s3 penetrating through the first insulating layer 66, and a fourth part 160s4 extending into the uppermost connection pattern 60 and in contact with the uppermost connection pattern 60, similar to the peripheral contact plug 140' described in FIG. 4.

For example, in the peripheral contact plug 160", a maximum width of the first portion 160s1 may be greater than a minimum width of the second portion 160s2; the maximum width of the first portion 160s1 may be greater than a minimum width of the fourth portion 160s4. In addition, a maximum width of the third portion 160s3 may be greater than a minimum width of the second portion 160s2. In the peripheral contact plug 160", the maximum width of the third portion 160s3 may be greater than the minimum width of the fourth portion 160s4, and the maximum width of the third portion 160s3 may be greater than the maximum width of the fourth portion 160s4. In the peripheral contact plug 160", the side surface of the second portion 160s2 may be concave compared to the sides of the first portion 1690s1 and the third portion 160s3.

The first insulating layer 766, the capping layer 769, and the second insulating layer 772 may replace the first insulating layer (e.g., the first insulating layer 66 in FIGS. 2A, 4 and/or 10), the capping layer (e.g., the capping layer 69 of FIGS. 2A, 4 and/or 10), and/or the second insulating layer (e.g., the second insulating layer 72 of FIGS. 2A, 4 and/or 10), which are described above. Similarly, the first insulating layer 766, the capping layer 769, and the second insulating layer 772 may replace the first insulating layer (66' in FIGS. 5, 6 and 11), the capping layer (69' in FIGS. 5, 6 and 11), and the second insulating layer (72' in FIGS. 5, 6 and 11), which are described with reference to FIGS. 5, 6 and 11, and may replace the first insulating layer (66' in FIGS. 7, 8 and 12), the capping layer (69' in FIGS. 7, 8 and 12) and the second insulating layer (72' in FIGS. 7, 8 and 12), which are described with reference to FIGS. 7, 8 and 12.

Hereinafter, an example in which the first insulating layer 766, the capping layer 769, and the second insulating layer 772 replace the first insulating layer 66' in FIG. 5, the capping layer 69' in FIG. 5, and the second insulating layer 72' in FIG. 5 will be described with reference to FIG. 15. In addition, an example in which the first insulating layer 766, the capping layer 769, and the second insulating layer 772 replace the first insulating layer 66" in FIG. 7, the capping layer 69 in FIG. 7, and the second insulating layer 72" in FIG. 7 will be described with reference to FIG. 16.

Figure 15:
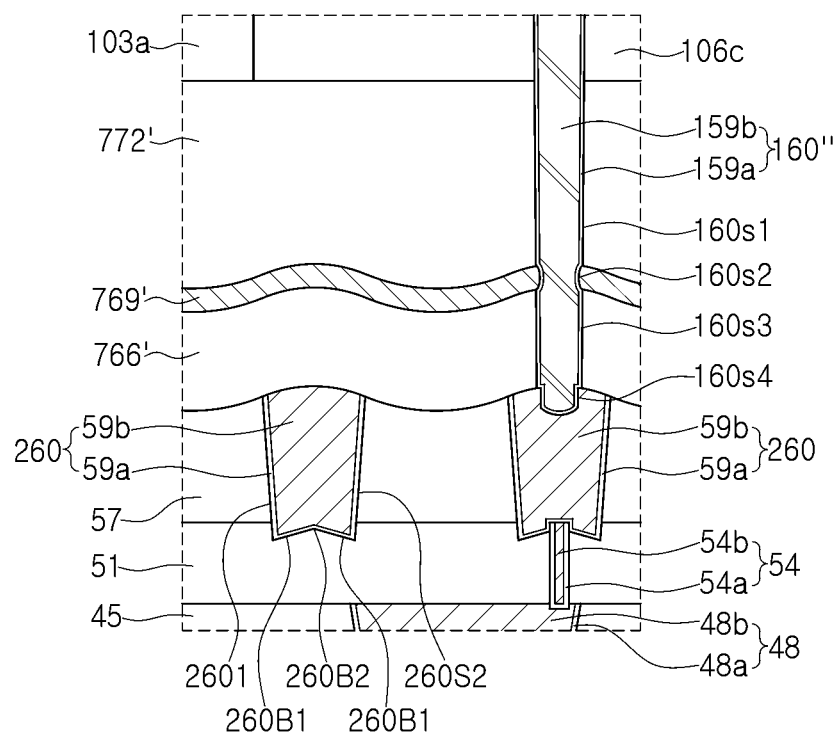
FIG. 15 is a schematic partially enlarged cross-sectional view illustrating a modified example of a semiconductor device according to some example embodiments.

Referring to FIG. 15, the first insulating layer (e.g., the first insulating layer 66' in FIG. 5), the capping layer (e.g., the capping layer 69' in FIG. 5), and the second insulating layer (e.g., the second insulating layer 72' in FIG. 5) may be replaced by a first insulating layer 766', a capping layer 769' and a second insulating layer 772', respectively. The first insulating layer 766', the capping layer 769' and the second insulating layer 772' may have the same thickness as that of the first insulating layer 766 in FIGS. 13 and/or 14, the capping layer 769 in FIGS. 13 and/or 14, and the second insulating layer 772 in FIGS. 13 and/or 14.

The first insulating layer 766' may have a wavy upper surface similar to the upper surface of the first insulating layer 66' described with reference to FIG. 5, and the capping layer 769' may have the same shape and same thickness as the capping layer 69' described with reference to FIG. 5, and the second insulating layer 772' may have a wavy patterned lower surface and a flat upper surface.

Figure 16:
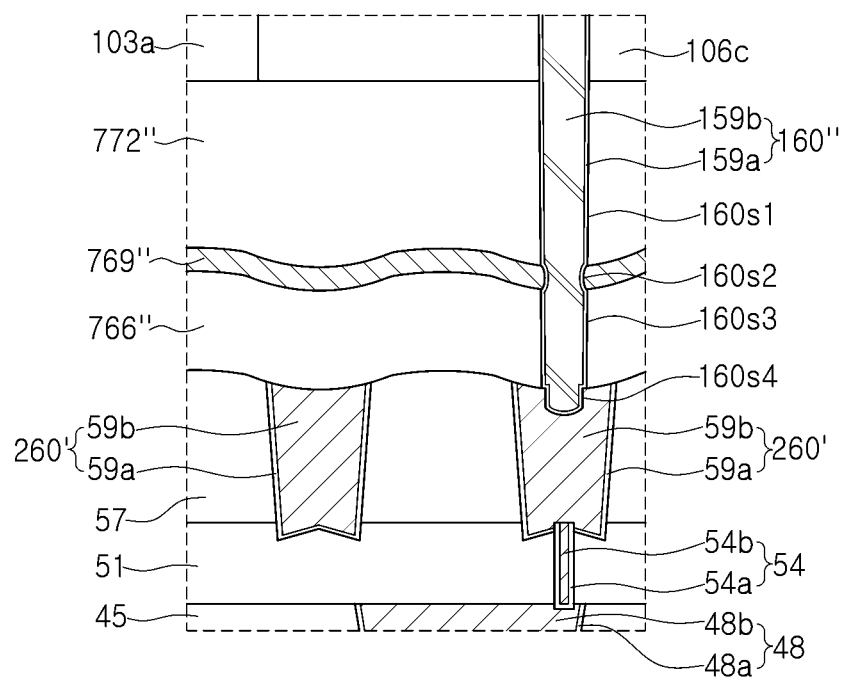
FIG. 16 is a schematic partially enlarged cross-sectional view illustrating a modified example of a semiconductor device according to some example embodiments.

Referring to FIG. 16, a first insulating layer 766", a capping layer 769" and a second insulating layer 772" may be disposed, which may replace the first insulating layer (e.g., the insulating layer 66" in FIG. 7), the capping layer (e.g., the capping layer 69" in FIG. 7) and the second insulating layer (e.g., the second insulating layer 72" in FIG. 7), respectively. The first insulating layer 766", the capping layer 769", and the second insulating layer 772" may have the same thickness of that of the first insulating layer 766 of FIGS. 13 and/or 14), the capping layer 769 in FIGS. 13 and/or 14), and the second insulating layer 772 in FIGS. 13 and/or 14.

The first insulating layer 766" may have a wavy upper surface that is the same as that of the upper surface of the first insulating layer 66" described with reference to FIG. 7, and the capping layer 769" may have the same shape and same thickness as the capping layer 69" described in FIG. 7, and the second insulating layer 772" may have a wavy patterned lower surface and a flat upper surface.

Figure 17:
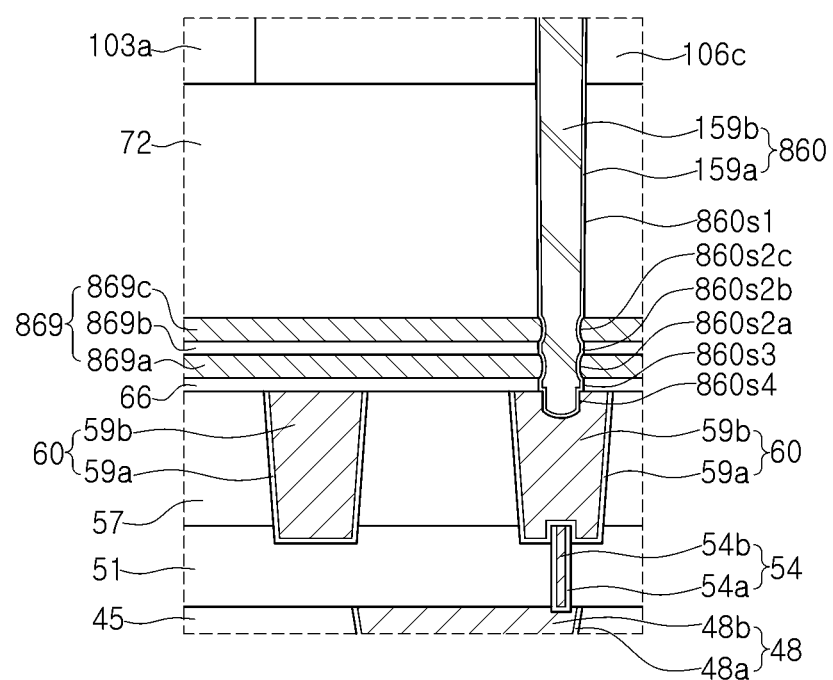
FIG. 17 is a schematic partially enlarged cross-sectional view illustrating a modified example of a semiconductor device according to some example embodiments.

The capping layer (e.g., the capping patterns 69 in FIGS. 2A, 4 and 10, 69' in FIGS. 5, 6 and 11, 69" in FIGS. 7, 8 and 12, 769 in FIG. 14, 769' in FIG. 15, and/or 769" in FIG. 16) described above with reference to FIGS. 1A to 16 may be formed of a single material layer, but the example embodiments are not limited thereto. For example, the capping layer (e.g., the capping layers 69 in FIGS. 2A, 4 and 10, 69' in FIGS. 5, 6 and 11, 69" in FIGS. 7, 8 and 12, 769 in FIG. 14, 769' in FIG. 15, and/or 769" in FIG. 16) may include a plurality of layers. FIG. 17 is a partially enlarged view illustrating a modified example of the capping layer 69 of FIG. 4 including a plurality of layers. Though FIG. 17 is based on a modified example of FIG. 4, similar disclosures would also apply to the capping layers 69' in FIGS. 5, 6 and 11, 69" in FIGS. 7, 8 and 12, 769 in FIG. 14, 769' in FIG. 15, and/or 769" in FIG. 16.

Referring to FIG. 17, the capping layer (e.g., the capping layer 69 in FIGS. 2A, 4 and 10, 69' in FIGS. 5, 6 and 11, 69" in FIGS. 7, 8 and 12, 769 in FIG. 14, 769' in FIG. 15, 769" in FIG. 16) may be replaced with a capping layer 869 including at least a first layer 869a, a second layer 869b, and a third layer 869c that are sequentially stacked. For example, the first and third capping layers 869a and 869c may be formed of silicon nitride, and the second layer 869b may be formed of silicon oxide.

The above-described peripheral contact plug (e.g., the peripheral contact plug 160 in FIG. 4) may be replaced with a peripheral contact plug 860 that includes an upper portion 160s1 penetrating through the second insulating layer 72, second portions 860s2a, 860s2b and 860s2c penetrating through the capping layer 869, a third portion 860s3 penetrating through the first insulating layer 66, and a fourth part 860s4 extending into the uppermost connection pattern 60 and contacting the uppermost connection pattern 60. In the peripheral contact plug 860, the second portions 860s2a, 860s2b, and 860s2c penetrating through the capping layer 869 may include a lower portion 860s2a penetrating through the first layer 869a, an intermediate portion 860s2b penetrating through the second layer 869b, and an upper portion 860s2c penetrating through the third layer 869c. In the peripheral contact plug 860, the lower portion 860s2 and the upper portion 860s2c may have concave sides.

Figure 18:
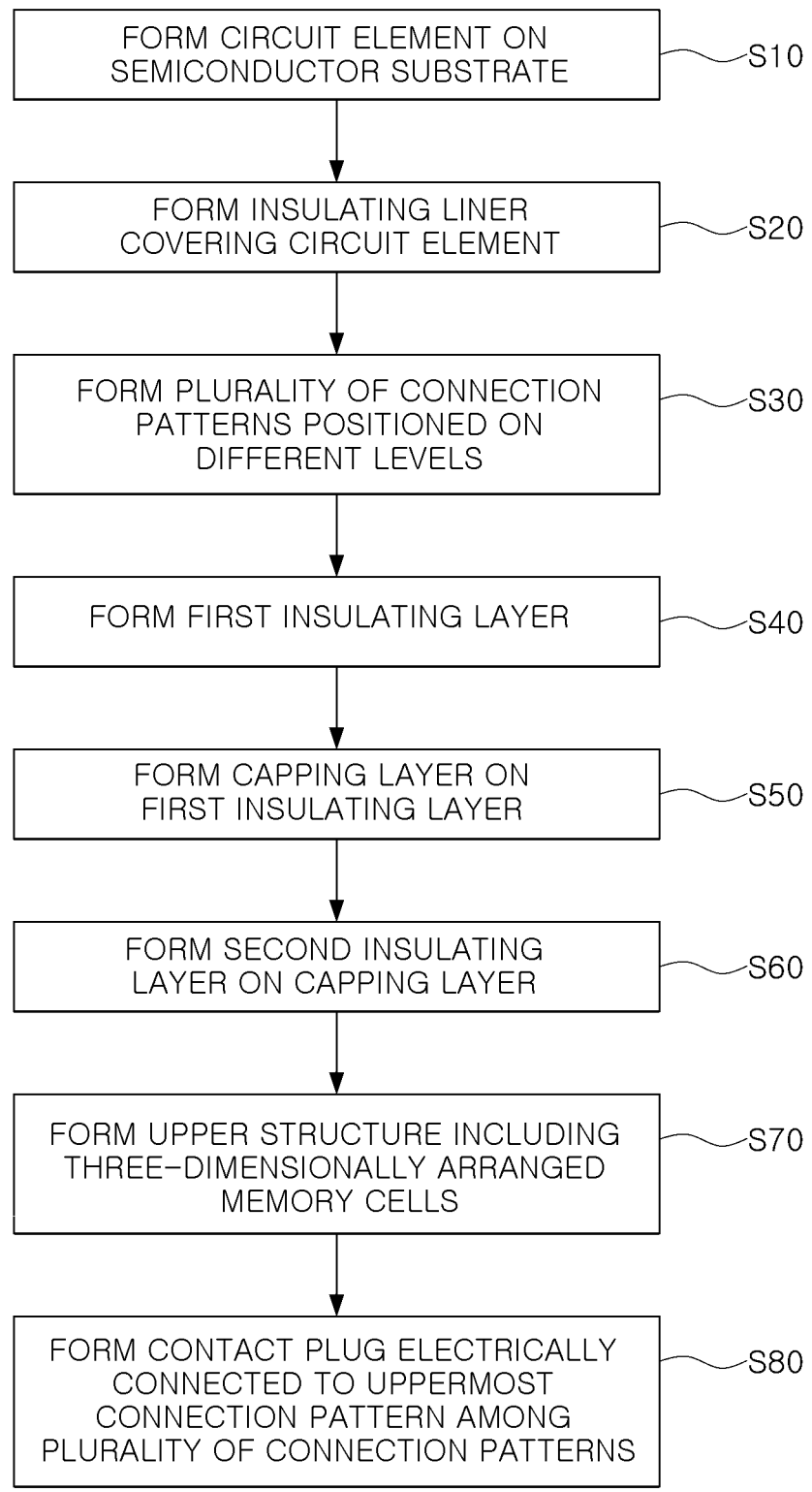
FIG. 18 is a process flow diagram schematically illustrating an example of a method of forming a semiconductor device according to some example embodiments.

Next, an example of a method of forming a semiconductor device according to some example embodiments will be described with reference to FIG. 18. FIG. 18 is a process flow diagram illustrating an example of a method of forming a semiconductor device according to some example embodiments.

Referring to FIG. 18, a circuit element may be formed on a semiconductor substrate (S10). The circuit element may include the circuit element 21 formed on the semiconductor substrate 3 as described in FIGS. 1A, 1B and 2B. An insulating liner covering the circuit element may be formed (S20). The insulating liner may be the insulating liner 24 as described in FIGS. 1A, 1B and 2B.

A plurality of connection patterns positioned on different levels may be formed (S30). The plurality of connection patterns may be the plurality of connection patterns 36, 48, and 60 as described with reference to FIGS. 1A and 1B.

A first insulating layer may be formed (S40). The first insulating layer may be the first insulating layer 66 as described with reference to FIGS. 1A, 1B and 2A. A capping layer may be formed on the first insulating layer (S50). The capping layer may be the capping layer 69 as described in FIGS. 1A, 1B and 2A. A second insulating layer may be formed on the capping layer (S60). The second insulating layer may be the second insulating layer 72 as described with reference to FIGS. 1A, 1B and 2A.

An upper structure including three-dimensionally arranged memory cells may be formed (S70). The upper structure may be the upper structure US as described with reference to FIGS. 1A and 1B. A contact plug electrically connected to an uppermost connection pattern among the plurality of connection patterns may be formed (S80). The contact plugs may be the peripheral contact plugs 160 as described with reference to FIGS. 1A, 1B, and 2A.

Next, a data storage system including a semiconductor device according to an example embodiment will be described with reference to FIGS. 19 and 20 and 21, respectively.

Figure 19:
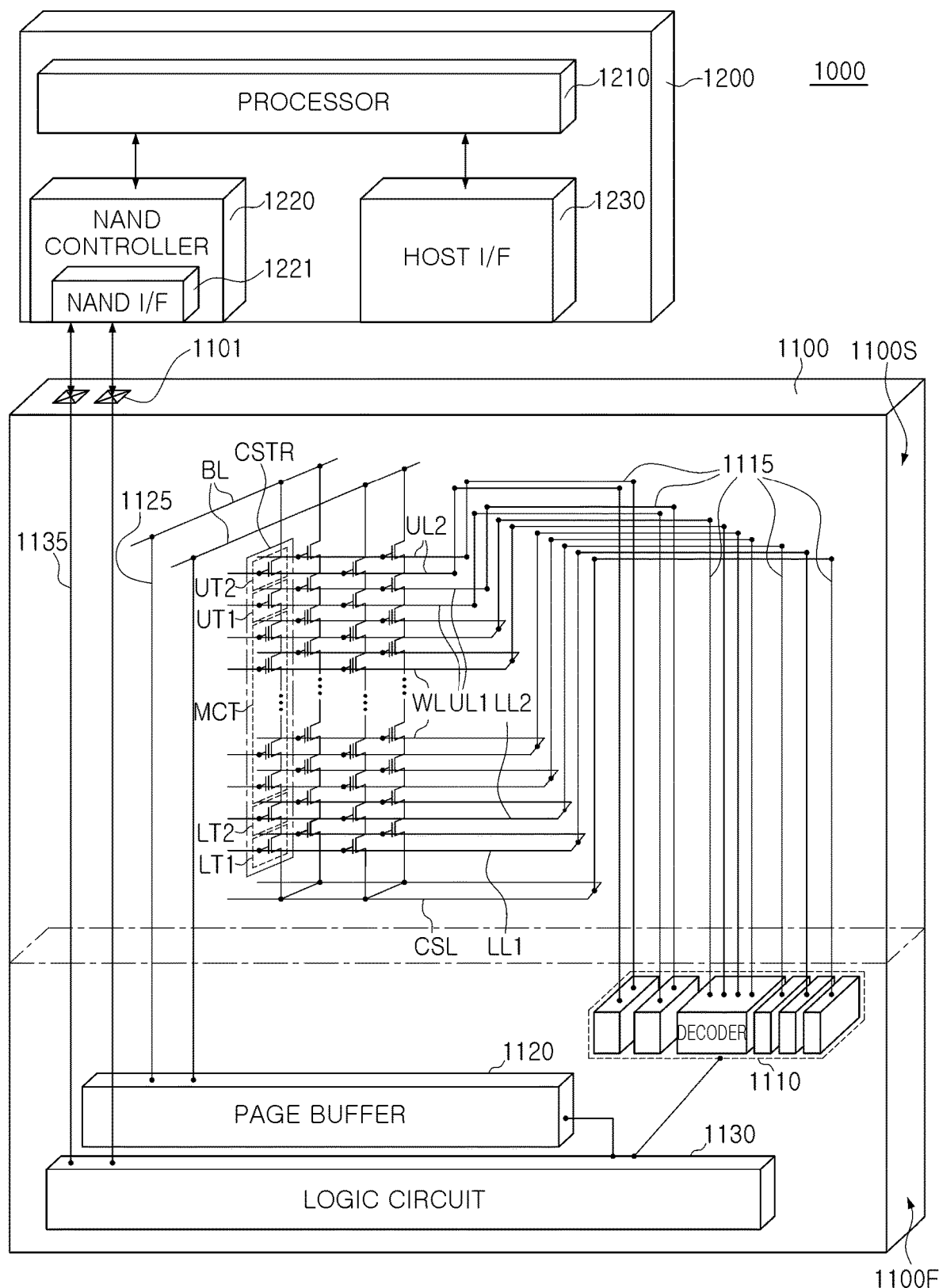
FIG. 19 is a diagram schematically illustrating a data storage system including a semiconductor device according to some example embodiments.

FIG. 19 is a diagram schematically illustrating a data storage system including a semiconductor device according to some example embodiments.

Referring to FIG. 19, a data storage system 1000 according to some example embodiments may include a semiconductor device 1100, and a controller 1200 electrically connected to the semiconductor device 1100 to control the semiconductor device 1100. The data storage system 1000 may be a storage device including the semiconductor device 1100 and/or an electronic device including the storage device. For example, the data storage system 1000 may be a solid state drive (SSD) device, a universal serial bus (USB), a computing system, a medical device, a communication device, and/or the like including the semiconductor device 1100.

In an example embodiment, the data storage system 1000 may be an electronic system that stores data.

The semiconductor device 1100 may include a first structure 1100F and a second structure 1100S on the first structure 1100F. The semiconductor device 1100 may be a semiconductor device according to any one of the example embodiments described above with reference to FIGS. 1 to 17.

For example, the first structure 1110F may be the lower structure LS described with reference to FIGS. 1A and 1B, and the second structure 1100S may be the upper structure US described with reference to FIGS. 1A and 1B.

The first structure 1100F may be a peripheral circuit structure including a decoder circuit 1110, a page buffer 1120, and/or a logic circuit 1130. For example, the first structure 1100F may include the above-described circuit element 21 (e.g., in FIGS. 1A, 1B, and 2B). The circuit element 21 (e.g., in FIGS. 1A, 1B and 2B) may be a transistor constituting a peripheral circuit structure including a decoder circuit 1110, a page buffer 1120, and a logic circuit 1130.

The second structure 1100S may be a memory structure including a bit line BL, a common source line CSL, word lines WL, first and second upper gate lines UL1 and UL2, first and second lower gate lines LL1 and LL2, and memory cell strings CSTR between the bit line BL and the common source line CSL.

The upper substrate 103 described above may include a silicon layer having an N-type conductivity. In some example embodiments, the silicon layer having an N-type conductivity may be and/or include the common source line CSL. For example, the first intermediate pattern layer 103b1 (e.g., in FIG. 3) in contact with the channel layer 139 (e.g., in FIG. 3) and the lower pattern layer 103a (e.g., in FIG. 3) in contact with the first intermediate pattern layer 103b1 may be formed of a silicon layer having an N-type conductivity, and may be the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified depending on example embodiments.

In some example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

The first and second gate layers (e.g., 112g and 124g in FIGS. 1A and 1B) described above may constitute the lower gate lines LL1 and LL2, the word lines WL, and the upper gate lines UL1 and UL2.

In some example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation of deleting data stored in the memory cell transistors MCT using, for example, a gate induced leakage current (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection interconnections 1115 extending from the first structure 1100F to the second structure 1100S.

The bit lines BL may be electrically connected to the page buffer 1120 through second connection interconnections 1125 extending from the first structure 1100F to the second structure 1100S. The bit lines BL may be the bit lines 178a of FIGS. 1A and 1B described above.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by a logic circuit 1130.

The semiconductor device 1100 may further include an input/output pad 1101. The semiconductor device 1100 may communicate with the controller 1200 through the input/output pad 1101 electrically connected to the logic circuit 1130. The input/output pad 1101 may be electrically connected to the logic circuit 1130 through an input/output connection wiring 1135 extending from the first structure 1100F to the second structure 1100S. Accordingly, the controller 1200 may be electrically connected to the semiconductor device 1100 through the input/output pad 1101, and may control the semiconductor device 1100.

The controller 1200 may include a processor 1210, a NAND controller 1220, and a host interface 1230. In some embodiments, the data storage system 1000 may include a plurality of semiconductor devices 1100. In this case, the controller 1200 may control the plurality of semiconductor devices 1100.

The processor 1210 may control the overall operation of the data storage system 1000 including the controller 1200. The processor 1210 may operate according to a predetermined (and/or otherwise determined) firmware, and may access the semiconductor device 1100 by controlling the NAND controller 1220. The NAND controller 1220 may include a NAND interface 1221 that processes communication with the semiconductor device 1100. Through the NAND interface 1221, a control command for controlling the semiconductor device 1100, data to be written to the memory cell transistors MCT of the semiconductor device 1100, and data to be read from the memory cell transistors MCT may be transmitted. The host interface 1230 may provide a communication function between the data storage system 1000 and an external host. When receiving a control command from an external host through the host interface 1230, the processor 1210 may control the semiconductor device 1100 in response to the control command.

The controller 1200 and/or its components (e.g., the processor 1210, NAND controller 1220, and/or host interface 1230) may include and/or be included in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

Figure 20:
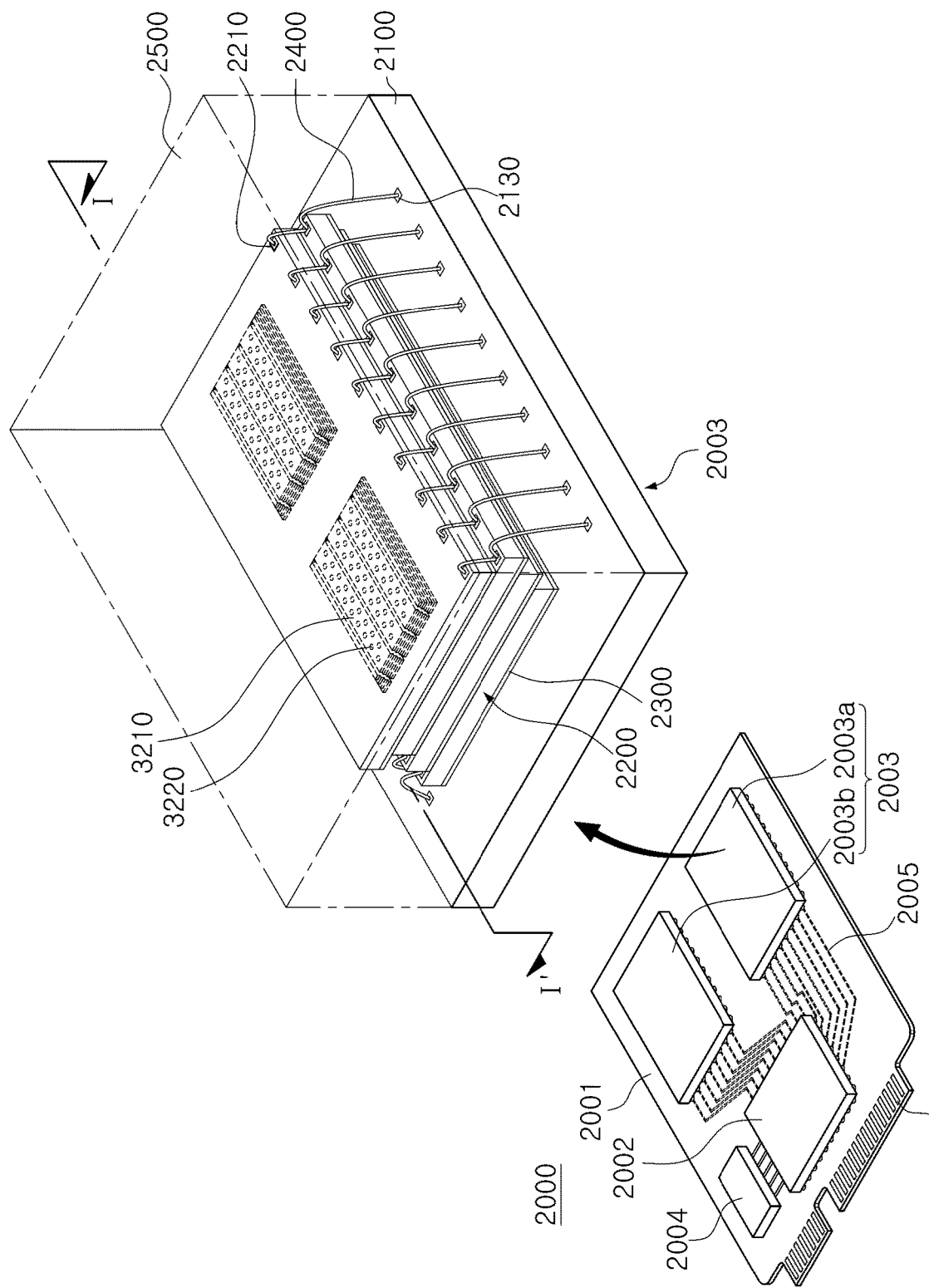
FIG. 20 is a perspective view schematically illustrating a data storage system including a semiconductor device according to some example embodiments.

FIG. 20 is a perspective view schematically illustrating a data storage system including a semiconductor device according to some example embodiments.

Referring to FIG. 20, a data storage system 2000 according to some example embodiments may include a main board 2001, a controller 2002 mounted on the main board 2001, one or more semiconductor packages 2003, and a DRAM 2004. The semiconductor package 2003 and the DRAM 2004 may be connected to the controller 2002 by wiring patterns 2005 formed on the main board 2001.

The main board 2001 may include a connector 2006 including a plurality of pins coupled to an external host. The number and arrangement of the plurality of pins in the connector 2006 may vary depending on a communication interface between the data storage system 2000 and the external host. In some example embodiments, the data storage system 2000 may communicate with an external host according to any one of interfaces such as Universal Serial Bus (USB), Peripheral Component Interconnect Express (PCI-Express), Serial Advanced Technology Attachment (SATA), M-Phy for Universal Flash Storage (UFS), and/or the like. In some example embodiments, the data storage system 2000 may be operated by power supplied from an external host through the connector 2006. The data storage system 2000 may further include a Power Management Integrated Circuit (PMIC) that distributes power supplied from the external host, to the controller 2002 and the semiconductor package 2003.

The controller 2002 may write data to and/or read data from the semiconductor package 2003, and may improve the operating speed of the data storage system 2000. In some embodiments, the controller 2002 may be, include, and or be included in, the controller 1200 of FIG. 19.

The DRAM 2004 may be a buffer memory for reducing a speed difference between the semiconductor package 2003 serving as a data storage space and an external host. The DRAM 2004 included in the data storage system 2000 may also operate as a kind of cache memory, and may provide a space for temporarily storing data in a control operation for the semiconductor package 2003. When the DRAM 2004 is included in the data storage system 2000, the controller 2002 may further include a DRAM controller for controlling the DRAM 2004, in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the semiconductor chips 2200 may include the semiconductor device according to the example embodiments described above with reference to FIGS. 1 to 17.

Each of the first and second semiconductor packages 2003a and 2003b may include a package substrate 2100, semiconductor chips 2200 on the package substrate 2100, adhesive layers 2300 disposed on lower surfaces of the semiconductor chips 2200 respectively, a connection structure 2400 electrically connecting the semiconductor chips 2200 and the package substrate 2100, and a molding layer 2500 covering the semiconductor chips 2200 and the connection structure 2400, on the package substrate 2100.

The package substrate 2100 may be a printed circuit board including upper package pads 2130. Each of the semiconductor chips 2200 may include an input/output pad 2210.

In example embodiments, the connection structure 2400 may be a bonding wire electrically connecting the input/output pad 2210 and the package upper pads 2130. Accordingly, in each of the first and second semiconductor packages 2003a and 2003b, the semiconductor chips 2200 may be electrically connected to each other by a bonding wiring method, and may be electrically connected to the package upper pads 2130 of the package substrate 2100. According to example embodiments, in each of the first and second semiconductor packages 2003a and 2003b, the semiconductor chips 2200 may also be electrically connected to each other by a connection structure including a through-silicon via (TSV), instead of the bonding wiring-type connection structure 2400.

In example embodiments, the controller 2002 and the semiconductor chips 2200 may be included in a single package. For example, the controller 2002 and the semiconductor chips 2200 may be mounted on a separate interposer substrate different from the main substrate 2001, and the controller 2002 and the semiconductor chips 2200 may be connected to each other by the wiring formed on the interposer substrate.

Figure 21:
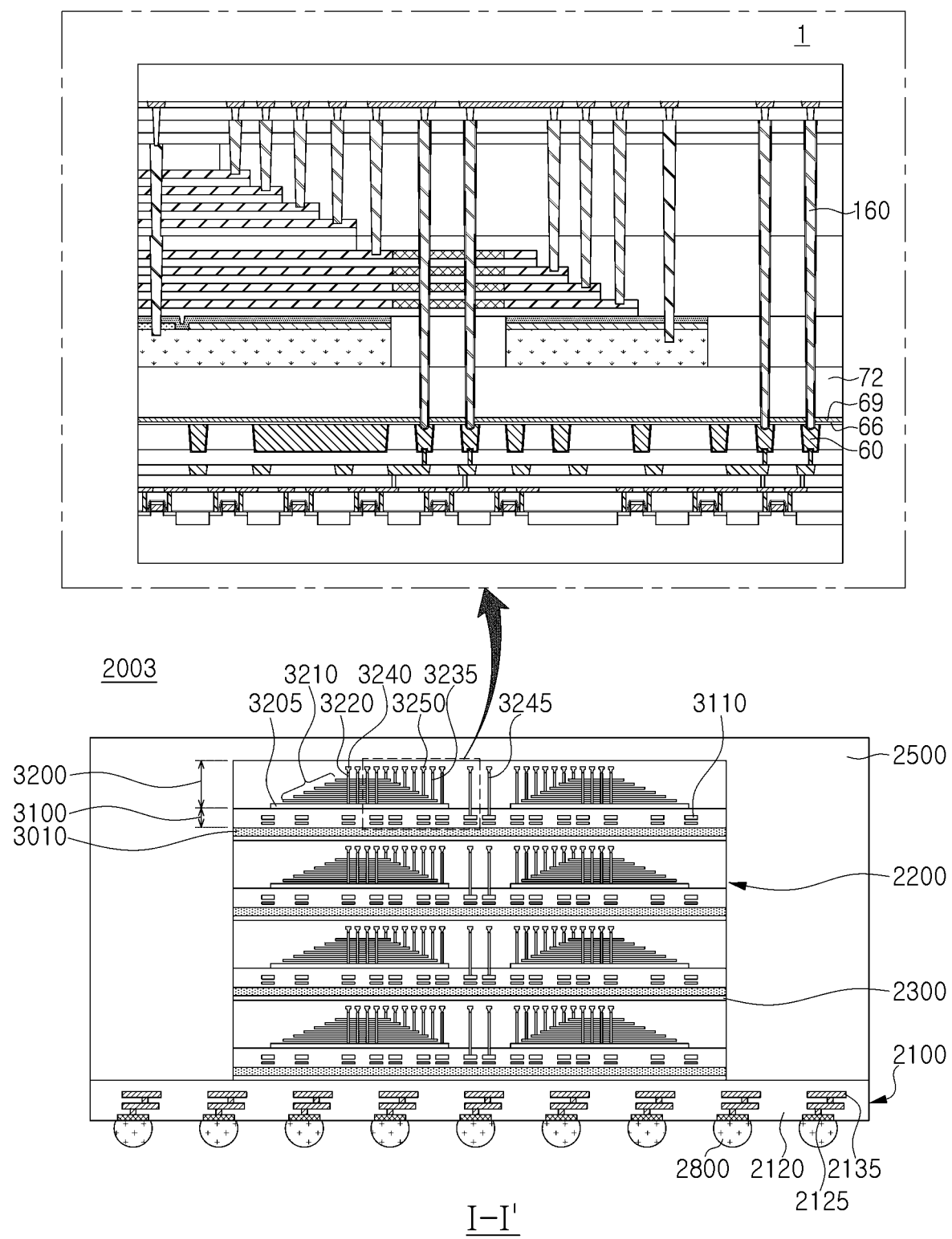
FIG. 21 is a cross-sectional view schematically illustrating a data storage system including a semiconductor device according to some example embodiments.

FIG. 21 illustrates cross-sectional views schematically illustrating a semiconductor package according to an example embodiment. FIG. 21 illustrates an example embodiment of the semiconductor package 2003 of FIG. 20, and conceptually illustrates a region of the semiconductor package 2003, taken along line I-I' of FIG. 20.

Referring to FIG. 21, in a semiconductor package 2003, a package substrate 2100 may be a printed circuit board. The package substrate 2100 may include a package substrate body portion 2120, package upper pads 2130 disposed on the upper surface of the package substrate body portion 2120, lower pads 2125 disposed on the lower surface of the package substrate body portion 2120 or exposed through the lower surface thereof, and internal wirings 2135 electrically connecting the upper pads 2130 and the lower pads 2125 inside of the package substrate body portion 2120. The upper pads 2130 may be electrically connected to the connection structures 2400. The lower pads 2125 may be connected to wiring patterns 2005 of a main substrate 2010 of a data storage system 2000 through conductive connection portions 2800.

Each of semiconductor chips 2200 may include a semiconductor substrate 3010, and a first structure 3100 and a second structure 3200 that are sequentially stacked on the semiconductor substrate 3010. The first structure 3100 may include a peripheral circuit region including peripheral interconnections 3110. The second structure 3200 may include a common source line 3205, a gate stack structure 3210 on the common source line 3205, memory channel structures 3220 and separation structures 3230 penetrating through the gate stack structure 3210, bit lines 3240 electrically connected to the memory channel structures 3220, and gate contact plugs (106 in FIG. 2A) electrically connected to the word lines WL of the gate stack structure 3210. The first structure 3100 may include the first structure 1100F of FIG. 19, and the second structure 3200 may include the second structure 1100S of FIG. 19.

Each of the semiconductor chips 2200 may include a through interconnection 3245 electrically connected to the peripheral interconnections 3110 of the first structure 3100 and extending into the second structure 3200. The through interconnection 3245 may penetrate through the gate stack structure 3210 and may be further disposed outside of the gate stack structure 3210.

Each of the semiconductor chips 2200 may further include an input/output connection wiring 3265 which is electrically connected to the peripheral interconnections 3110 of the first structure 3100 and extends into the second structure 3200, and an input/output pad 2210 electrically connected to the input/output connection wiring 3265.

In FIG. 21, a partially enlarged portion of the semiconductor device 1 indicated by reference numeral 1 is to describe that the semiconductor chips 2200 of FIG. 21 may be modified to include the cross-sectional structure as in FIG. 1A. Accordingly, each of the semiconductor chips 2200 may include the semiconductor device 1 according to the example embodiments described above with reference to FIGS. 1A to 17.

As set forth above, according to some example embodiments, a circuit interconnection structure including a plurality of connection patterns disposed on different levels on a semiconductor substrate, and a lower insulating structure covering the circuit interconnection structure, may be disposed. An upper structure, including a stack structure including interlayer insulating layers and gate electrodes alternately stacked on the lower insulating structure in a vertical direction, and a vertical memory structure penetrating through the stack structure in the vertical direction, may be disposed. The portion of the lower insulating structure located on a level higher than the uppermost connection pattern may include a first insulating layer, a capping layer and a second insulating layer sequentially stacked. The capping layer may be formed of a material different from the material of the first insulating layer and the second insulating layer. The first insulating layer, the capping layer, and the second insulating layer sequentially stacked in this manner may protect the circuit element and the circuit interconnection structure from a semiconductor process of forming the upper structure. For example, the first insulating layer, the capping layer, and the second insulating layer may reduce and/or prevent the uppermost connection pattern from being deformed or damaged by heat generated during a semiconductor process of forming the upper structure.

In addition, by disposing the first insulating layer between the capping layer and the uppermost connection pattern, leakage current between adjacent uppermost connection patterns may be mitigated and/or prevented.

Accordingly, the degree of integration of the circuit interconnection structure may be improved by forming the portion of the lower insulating structure positioned on a level higher than the uppermost connection pattern, as the first insulating layer, the capping layer and the second insulating layer that are sequentially stacked. Therefore, the degree of integration of the semiconductor device may be improved.

While example embodiments have been illustrated and described above, it will be apparent to those skilled in the art that modifications and variations could be made without departing from the scope of the present inventive concepts as defined by the appended claims.

What is claimed is:

1. A semiconductor device comprising:
a lower structure including
   a semiconductor substrate,
   a circuit element on the semiconductor substrate,
   a circuit interconnection structure on the semiconductor substrate, the circuit interconnection structure including a plurality of connection patterns on different levels and electrically connected to the circuit element, and
   a lower insulating structure covering the circuit element and the circuit interconnection structure;
an upper structure including
   an upper substrate in contact with an upper surface of the lower insulating structure,
   a stack structure on the upper substrate, the stack structure including interlayer insulating layers and gate electrodes alternately stacked in a vertical direction, and
   a vertical memory structure penetrating through the stack structure in the vertical direction; and
a contact plug penetrating through at least a portion of the lower insulating structure such that the contact plug contacts an uppermost connection pattern, among the plurality of connection patterns,
wherein the lower insulating structure includes a first insulating layer, a capping layer and a second insulating layer sequentially stacked in a region between the upper substrate and the uppermost connection pattern, and
the capping layer includes a material different from a material of the first insulating layer and a material of the second insulating layer.

2. The semiconductor device of claim 1, wherein
a thickness of the second insulating layer is greater than a thickness of the capping layer, and
a thickness of the first insulating layer is less than the thickness of the capping layer.

3. The semiconductor device of claim 1, wherein a thickness of the capping layer ranges from about 150 Angstroms (Å) to about 500 Å.

4. The semiconductor device of claim 1, wherein a thickness of the capping layer ranges from about 300 Angstroms (Å) to about 400 Å.

5. The semiconductor device of claim 1, wherein a thickness of the first insulating layer is greater than about 10 Angstroms (Å) and less than a thickness of the capping layer.

6. The semiconductor device of claim 1, wherein a thickness of the first insulating layer is greater than about 30 Angstroms (Å) and less than a thickness of the capping layer.

7. The semiconductor device of claim 1, wherein
the material of the first insulating layer and the material of the second insulating layer are silicon oxide, and
the material of the capping layer is silicon nitride.

8. The semiconductor device of claim 1, wherein
when viewed in longitudinal cross-section, the uppermost connection pattern includes first and second sides opposing each other, and an upper surface extending from upper ends of the first and second sides,
the upper surface of the uppermost connection pattern is at least partially curved shape, and
the contact plug penetrates through a portion of the upper surface of the uppermost connection pattern.

9. The semiconductor device of claim 1, wherein
the uppermost connection pattern has a convex upper surface, and
the contact plug penetrates through a portion of the convex upper surface of the uppermost connection pattern.

10. The semiconductor device of claim 9, wherein
the capping layer includes a first capping insulating region having a first upper surface and a second capping insulating region having a second upper surface
the second upper surface is higher than the first upper surface,
the second capping insulating region overlaps the uppermost connection pattern, and
the contact plug penetrates through a portion of the second capping insulating region.

11. The semiconductor device of claim 1, wherein
the circuit interconnection structure further comprises a via below the uppermost connection pattern, the via contacting the uppermost connection pattern, and
an upper surface of the via and a side surface of an upper region of the via are in contact with the uppermost connection pattern.

12. The semiconductor device of claim 1, wherein the uppermost connection pattern includes an inclined side increasing in width from a lower area toward an upper area, and a lower surface extending from a lower end of the inclined side and including a region at a level higher than the lower end of the inclined side.

13. The semiconductor device of claim 1, wherein the uppermost connection pattern includes a side surface and a bottom surface forming an acute angle with the side surface.

14. The semiconductor device of claim 1, wherein
the contact plug includes a
   first portion penetrating through the second insulating layer,
   a second portion penetrating through the capping layer,
   a third portion penetrating through the first insulating layer, and
   a fourth portion penetrating through a portion of an upper surface of the uppermost connection pattern, and
in the contact plug, a side slope of the second portion is different from a side slope of the first portion.

15. The semiconductor device of claim 14, wherein in the contact plug, a side surface of the second portion has a curved shape, and a side surface of the first portion has a substantially straight shape.

16. The semiconductor device of claim 14, wherein in the contact plug, a maximum width of the fourth portion is less than a maximum width of the third portion.

17. A semiconductor device comprising:
an upper structure including
   an upper substrate,
   a stack structure including interlayer insulating layers and gate electrodes alternately stacked on the upper substrate in a vertical direction, and
   a vertical memory structure penetrating through the stack structure in the vertical direction;
a lower structure under the upper substrate, the lower structure including
   a semiconductor substrate,
   a circuit element on the semiconductor substrate,
   a circuit interconnection structure on the semiconductor substrate, the circuit interconnection structure including at least three connection patterns, the at least three connection patterns including an uppermost connection pattern in an uppermost portion, a lower connection pattern in a lower portion, and an intermediate connection pattern between the uppermost connection pattern and the lower connection pattern, an upper via electrically connecting the uppermost connection pattern and the intermediate connection pattern, and a lower insulating structure covering the circuit element and the circuit interconnection structure, the lower insulating structure including a first insulating layer, a capping layer and a second insulating layer sequentially stacked in a portion between the upper substrate and the uppermost connection pattern; and a contact plug penetrating through the first insulating layer, the capping layer, and the second insulating layer and extending into the uppermost connection pattern, wherein a thickness of the uppermost connection pattern is greater than a thickness of the intermediate connection pattern, the capping layer includes a material different from a material of the first insulating layer and a material of the second insulating layer, a thickness of the second insulating layer is greater than a thickness of the capping layer, the thickness of the capping layer is greater than a thickness of the first insulating layer, the uppermost connection pattern includes an upper surface of which at least a portion has a curved surface shape, and the contact plug penetrates through a portion of the upper surface of the uppermost connection pattern and extends into the uppermost connection pattern.

18. The semiconductor device of claim 17, wherein the upper via penetrates through a portion of a lower surface of the uppermost connection pattern and extends into the uppermost connection pattern, an upper end of the upper via is higher than the lower surface of the uppermost connection pattern, the uppermost connection pattern includes a metal material pattern and a conductive barrier layer covering a side surface and a bottom surface of the metal material pattern, the conductive barrier layer contacts an upper surface of the upper via and a side surface of an upper region of the upper via, the uppermost connection pattern has an inclined side surface and a lower surface including a portion forming an acute angle with the inclined side surface, the contact plug includes a first portion penetrating through the second insulating layer, a second portion penetrating through the capping layer, a third portion penetrating through the first insulating layer, and a fourth portion penetrating through a portion of the upper surface of the uppermost connection pattern, a side surface of the second portion of the contact plug is curved, and a side surface of the first portion of the contact plug is substantially straight, an upper surface of the contact plug is higher than an uppermost gate electrode among the gate electrodes, the upper substrate includes a silicon layer, and the vertical memory structure includes a channel layer in contact with the silicon layer.

19. A data storage system comprising:

a semiconductor device including an input/output pad; and a controller electrically connected to the semiconductor device through the input/output pad and configured to control the semiconductor device, wherein the semiconductor device further includes an upper structure including an upper substrate in contact with an upper surface of a lower insulating structure, a stack structure on the upper substrate, the stack structure including interlayer insulating layers and gate electrodes alternately stacked in a vertical direction, and a vertical memory structure penetrating through the stack structure in the vertical direction, a lower structure including a semiconductor substrate, a circuit element on the semiconductor substrate, a circuit interconnection structure including a plurality of connection patterns on different levels, the plurality of connection patterns electrically connected to the circuit element, and the lower insulating structure covering the circuit element and the circuit interconnection structure, the lower insulating structure including a first insulating layer, a capping layer and a second insulating layer sequentially stacked in a portion between the upper substrate and an uppermost connection pattern among the plurality of connection patterns, and a contact plug penetrating through at least a portion of the lower insulating structure such that the contact plug contacts the uppermost connection pattern, of the connection patterns, and the capping layer includes a material different from a material of the first insulating layer and a material of the second insulating layer.

20. The data storage system of claim 19, wherein the circuit interconnection structure further includes an upper via electrically connected to the uppermost connection pattern, the upper via penetrates through a portion of a lower surface of the uppermost connection pattern, an upper end of the upper via is higher than the lower surface of the uppermost connection pattern, the uppermost connection pattern includes a metal material pattern and a conductive barrier layer covering a side surface and a bottom surface of the metal material pattern, the conductive barrier layer contacts an upper surface of the upper via and a side surface of an upper region of the upper via, the uppermost connection pattern has an inclined side surface and a lower surface including a portion forming an acute angle with the inclined side surface, the contact plug includes a first portion penetrating through the second insulating layer, a second portion penetrating through the capping layer, a third portion penetrating through the first insulating layer, and a fourth portion penetrating through a portion of the upper surface of the uppermost connection pattern, a side surface of the second portion of the contact plug is curved, and a side surface of the first portion of the contact plug is substantially straight, an upper surface of the contact plug is higher than an uppermost gate electrode among the gate electrodes, the upper substrate includes a silicon layer, and the vertical memory structure includes a channel layer in contact with the silicon layer.

* * * * *